United States Patent
Tomoeda et al.

(10) Patent No.: US 6,870,771 B2
(45) Date of Patent: Mar. 22, 2005

(54) NONVOLATILE SEMICONDUCTOR MEMORY DEVICE THAT CAN SUPPRESS EFFECT OF THRESHOLD VOLTAGE VARIATION OF MEMORY CELL TRANSISTOR

(75) Inventors: Mitsuhiro Tomoeda, Hyogo (JP); Atsushi Ohba, Hyogo (JP); Toshimasa Makino, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 47 days.

(21) Appl. No.: 10/200,773

(22) Filed: Jul. 24, 2002

(65) Prior Publication Data

US 2003/0043629 A1 Mar. 6, 2003

(30) Foreign Application Priority Data

Aug. 28, 2001 (JP) .................................. 2001-257534

(51) Int. Cl.[7] .............................................. G11C 16/06
(52) U.S. Cl. ........................... 365/185.22; 365/185.29; 365/185.33
(58) Field of Search ....................... 365/185.22, 185.29, 365/185.33

(56) References Cited

U.S. PATENT DOCUMENTS

| | | | | |
|---|---|---|---|---|
| 5,297,096 A | * | 3/1994 | Terada et al. ............ | 365/185.11 |
| 5,428,568 A | | 6/1995 | Kobayashi et al. ...... | 365/185.24 |
| 5,793,678 A | | 8/1998 | Kato et al. .............. | 365/185.27 |
| 5,920,508 A | * | 7/1999 | Miyakawa et al. ...... | 365/185.22 |

* cited by examiner

*Primary Examiner*—Hoai Ho
*Assistant Examiner*—Tu-Tu Ho
(74) *Attorney, Agent, or Firm*—McDermott Will & Emery LLP

(57) ABSTRACT

In a memory block that is to be subjected to an erasure operation, voltage of the ground level is selectively supplied to only one word line. By applying an erasure pulse to a source line, memory cell transistors have their threshold voltages shifted. As to another word line, a pulse of a positive voltage is supplied in synchronization to the application of an erasure pulse to the source line. Another group of memory cell transistors do not have their threshold voltages shifted.

18 Claims, 20 Drawing Sheets

SELECTED BIT

SELECTED BIT

NONVOLATILE SEMICONDUCTOR MEMORY DEVICE THAT CAN SUPPRESS EFFECT OF THRESHOLD VOLTAGE VARIATION OF MEMORY CELL TRANSISTOR

BACKGROUND OF THE INVENTION

1. Field of the Invention

The present invention relates to nonvolatile semiconductor memory devices, particularly to a flash type nonvolatile semiconductor memory device.

2. Description of the Background Art

The flash type nonvolatile semiconductor memory device, i.e., the flash memory, has the capability to electrically write/erase a memory cell at one time. Such a nonvolatile semiconductor memory device is widely used in portable equipment by virtue of its low cost and electrically erasable function.

A flash memory employs, as a memory cell, a transistor including a control gate and a floating gate to allow change of the threshold voltage (referred to as "memory cell transistor" hereinafter).

A gate insulation film is present between the floating gate and the substrate. An insulation film is also present between the floating gate and the control gate. The floating gate is literally in an electrically floating status.

With regards to flash memories, the so-called "NOR type" flash memory is known. This NOR type flash memory is advantageous in that the write speed is high since, in the write operation, writing is effected with, for example, channel hot electrons.

In an erasure operation of the NOR type flash memory, the threshold voltage of the memory cell transistor is driven, for example, from the high level to the low level.

As one method of the erasure operation in such an NOR type flash memory, the so-called "edge draw type" method of drawing electrons in the floating gate to the source region at the time of erasure is known. As another erasure method, the "full channel plane draw type erasure" method that draws electrons to the entire plane of the channel is known. The NOR type flash memory employing the full channel plane draw type erasure method is advantageous in that the memory cell size can be scaled, i.e., reduced, as compared to the conventional edge draw type flash memory.

FIG. 18 is a flow chart showing an example of the simplest erasure sequence in a conventional flash memory.

Referring to FIG. 18, an erasure command is input at step S101. At step S102, an erasure pulse having a predetermined pulse width is applied to the memory cell transistor.

As step S103, the "erasure verification operation" determining whether data has been erased or not is effected. Determination is made of the threshold voltage of the memory cell transistor subjected to erasure pulse application.

When determination is made that the data stored in the memory cell has not been erased as step 103, control returns to step S102. The steps of S102 and S103 are repeated until the threshold voltage of the memory cell transistor becomes lower than a predetermined level of an erasure determined voltage to repeat the erasure pulse application and erasure verification operation.

When determination is made that the threshold voltage of the memory cell transistor is below the erasure determined voltage level, control proceeds to step S104, and the erasure operation ends.

FIG. 19 is a schematic diagram to describe the voltage applied to the memory cell transistor in a memory block according to the conventional first erasure pulse apply method carried out at step S102 of FIG. 18.

For the sake of simplification, the example of FIG. 19 is based on memory cell transistors arranged in 2 rows and 2 columns.

Referring to FIG. 19, the potential levels of a word line WL1 and a word line WL2 provided corresponding to respective rows of memory cells in the memory cell block are fixed to the ground potential in an erasure pulse application mode.

Bit lines BL1 and BL2 provided corresponding to the columns of memory cells in the memory cell block attain an open state during the erasure pulse application. A source line SL to supply a common source potential to the sources of the 2×2 memory cell transistors is applied with a pulse voltage that has, for example, a height of 10V and a width of 10 msec as the erasure pulse.

FIG. 20 is a schematic diagram of a memory block to describe the application of voltage according to the conventional second erasure pulse application method carried out at step S102 of the FIG. 21.

For the sake of simplification, the memory block in FIG. 20 is arranged with memory cell transistors of 2 rows and 2 columns, each having a floating gate. The applied erasure pulse is selected so that a source line potential $V_{SL}$ has an amplitude of, for example, 10V and a time width of 10 msec. Also, a voltage of a pulse with the amplitude of −10V and the time width of 10 msec is applied to all the word lines coupled to the control gates of the memory cell transistors of each row in the block in synchronization with the pulse application to the source line. Bit lines BL1 and BL2 coupled to the drains of the memory cell transistors of each row are all set to an open state.

The above-described pulse application method is employed in the aforementioned "full channel plane draw erasure" type NOR flash memory.

In this case, a pulse voltage similar to that applied to source line SL is applied, not only as source line potential $V_{SL}$ of the transistor, but also as a well potential $V_{WELL}$ of the transistor.

FIG. 21 is a diagram to describe the arrangement of the voltage applied to the memory cell transistor when the erasure pulse described with reference to FIG. 20 is applied.

Referring to FIG. 21, source potential $V_{SL}$ applied to the source of the memory cell transistor and well transistor $V_{WELL}$ applied to the substrate portion of the memory cell transistor are both set to 10V, as described above. Word line potential $V_{WL}$ applied to the word line to select a memory cell transistor is set to −10V. Here, the drain of the memory cell transistor is set to an open state. Therefore, a high electric field is applied between a gate G and a substrate SUB, as well as between gate G and a source S. Thus, electrons are drawn all over the channel plane of the memory cell transistor to effect erasure.

FIG. 22 is a schematic diagram to describe the voltage applied to a memory cell transistor in a conventional third erasure pulse application method carried out at step S102 of FIG. 18.

In the example of FIG. 22, an erasure pulse with the height of −10V and the width of 10 msec is applied to source line SL. Word lines WL1 and WL2 are both applied with an erasure pulse that has, for example, a height of 10V and a width of 10 msec. Here, bit lines BL1 and BL2 are in an open state.

In the case where such an erasure pulse is supplied, an erasure state is attained when the threshold voltage is pulled up from the low level to the high level and exceeds a predetermined level.

FIG. 23 is a diagram to describe the voltage applied to the memory cell transistor in an erasure verification operation carried out at step S103 according to the sequence of FIG. 18. It is assumed that n rows×m columns (n, m: natural number) of memory cell transistors are arranged in the block in FIG. 22.

Referring to FIG. 23, well potential $V_{WELL}$ and source potential $V_{SL}$ are both set to 0V. The potential of a word line WL (i) (1≦i≦n) to select a memory cell transistor corresponding to the selected bit is set to 3.5V. The other word lines are all set to 0V. A bit line BL (j) (1≦j≦m) connected to the memory cell transistor corresponding to the selected bit is set to 1.0V. All the other bit lines are set to 0V. By verifying the current flowing to the memory cell transistor with the above-described potential setting, the threshold voltage or the memory cell transistor can be confirmed. In other words, determination can be made whether erasure of the memory cell transistor has been effected or not.

FIG. 24 shows the voltage applied to the memory cell transistor corresponding to the selected bit of FIG. 23.

Referring to FIG. 24, the source and well of a selected memory cell transistor MT (j, i) are both set to 0V. 3.5V and 1.0V are applied to the gate and drain, respectively, of the memory cell transistor.

The voltage setting in a read mode in a conventional flash memory will be described here. FIG. 25 is a circuit diagram to describe the voltage setting in the read operation of a conventional flash memory.

Referring to FIG. 25, a word line WL (i) connected to the gate of the memory cell transistor corresponding to the selected bit is set to, for example, 4.5V. All the other word lines are set to 0V. Here, source line potential $V_{SL}$ and well potential $V_{WELL}$ are both set to 0V.

FIG. 26 shows the potential applied to the memory cell transistor selected in a read mode of FIG. 25.

Referring to FIG. 26, the source and well of the memory cell transistor corresponding to the selected bit are both set to 0V. 1.0V is applied to the drain and 4.5V is applied to the gate. When the threshold voltage of the memory cell transistor is high, no current flows from the drain to source. In contrast, when the threshold voltage of the memory cell transistor is low, current flows from the drain to the source. Therefore, determination can be made whether data is written into the memory cell transistor by detecting this current flow.

In a conventional NOR type flash memory, the erasure operation is carried out in block units of memory cells. An erasure pulse voltage is applied at one time to a plurality of memory cell transistors in the block.

It is to be noted that the electrical characteristic of each memory cell transistor is essentially variable. Therefore, variation will be exhibited in the threshold voltage of each memory cell after the erasure pulse is applied in the above-described one-time pulse application. There was a problem that it is difficult to set uniform the threshold voltage of each memory cell transistor.

When the variation in the threshold voltage is great, memory cells of the so-called "excessively erased" state will be present in the memory cell block. In the case where the threshold voltage is to be driven from a high level to a low level in an erasure operation in a memory cell block with such excessively-erased memory cells, the memory cell transistor of the excessively-erased state will become a depletion transistor. This means that much leakage current will flow when the gate voltage is 0V, i.e., even when the memory cell transistor is in a non-selected state.

The presence of such excessively-erased memory cell transistors will cause a great amount of leakage current to flow due to the excessively-erased memory cell transistors that are not selected on the same bit line when in, for example, an erasure verification operation. There is a problem that the value of the current flowing to the relevant memory cell transistor that is selected by the sum of the leakage current can no longer be identified. In other words, it was difficult to carry out an accurate verification operation. Furthermore, in some cases, it was difficult to carry out a read operation.

SUMMARY OF THE INVENTION

An object of the present invention is to provide a nonvolatile semiconductor memory device that has control to suppress effect of variation in the threshold voltage of a memory cell transistor in a block when erasure is carried out on a block-by-block basis.

According to an aspect of the present invention, a nonvolatile semiconductor memory device includes a control circuit, a memory cell array, a plurality of power supply lines, a plurality of word lines, a row select circuit, and a potential drive circuit.

The control circuit controls at least the erasure operation of the nonvolatile semiconductor memory device. The memory cell array has a plurality of memory cells arranged in a matrix. The memory cell array is divided into a plurality of memory blocks. Each memory cell includes a memory element that can store data in a nonvolatile manner. Each memory element includes a first node and a second node. Each memory element has the stored data erased by the application of a predetermined voltage across the first and second nodes.

The plurality of power supply lines are provided corresponding to respective memory blocks. Each power supply line supplies a first potential in common to the first node of the plurality of memory elements in a corresponding memory block. A plurality of word lines are provided corresponding to a row in the memory cell array. Each word line is coupled to the second node of the memory element belonging to the corresponding row. The row select circuit can selectively supply for each word line a second potential having a predetermined voltage with respect to the first potential under control of the control circuit. The potential drive circuit selectively supplies the first potential for every power supply line under control of the control circuit.

An advantage of the present invention is that application of an erasure pulse can be selectively altered for each word line since the erasure operation is under control for each word line, allowing suppression of the effect in the variation in the threshold voltage for the entire block.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
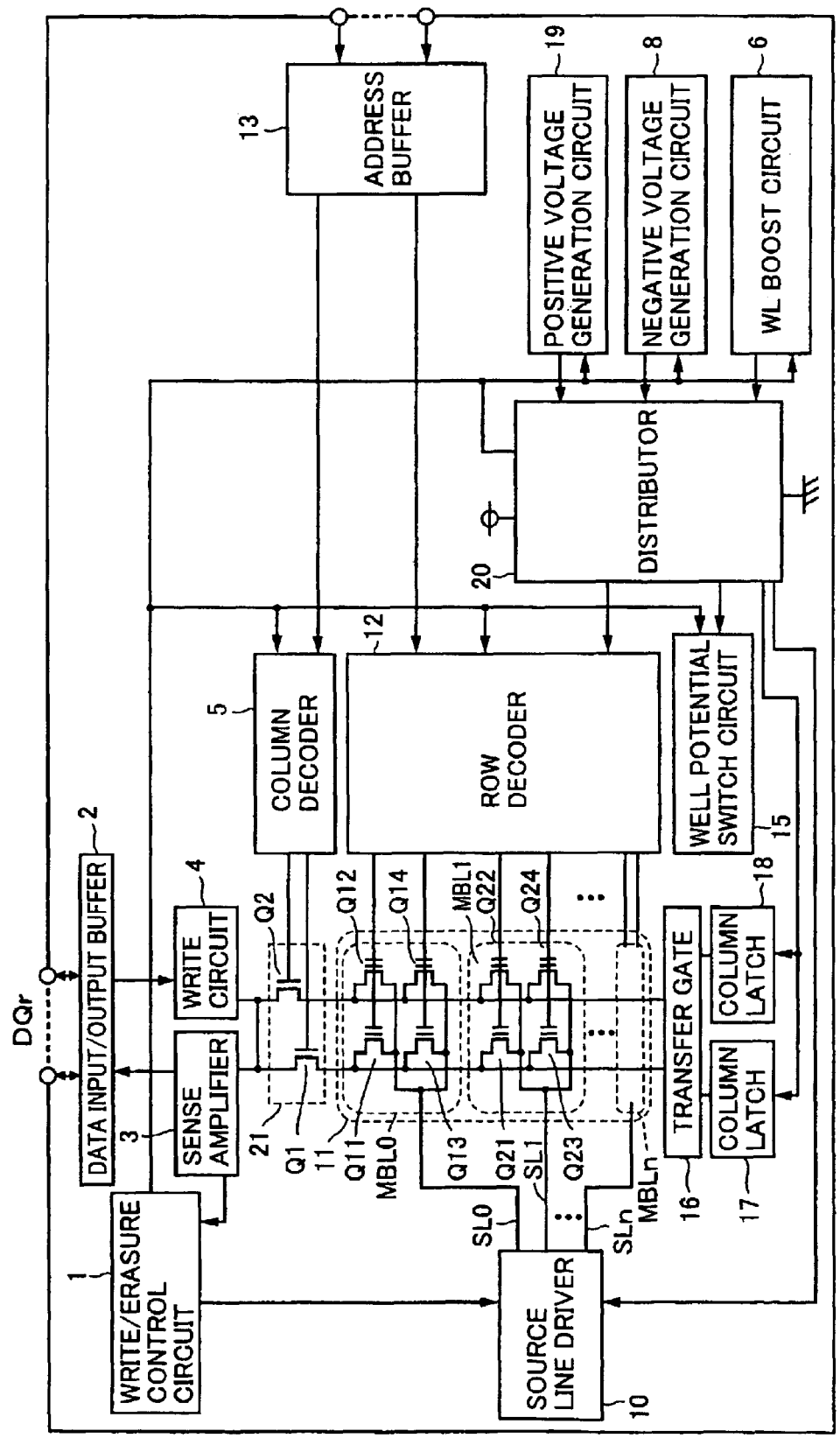
FIG. 1 is a schematic block diagram showing structure of a nonvolatile semiconductor memory device 1000 of the present invention.

Embodiments of the present invention will be described with reference to the drawings. In the drawings, the same or corresponding components have the same reference characters allotted.

First Embodiment

FIG. 1 is a schematic block diagram showing a structure of a nonvolatile semiconductor memory device 1000 of the present invention. FIG. 1 shows a flash memory as an example of a nonvolatile semiconductor memory device.

Referring to FIG. 1, a write/erasure control circuit 1 provides control on the timing of a write operation and erasure operation as well as the voltage in each operation.

An address buffer 13 receives an address signal from an address terminal Adr to select a predetermined memory cell in a memory cell array 11 to output a column address signal and a row address signal to a column decoder 5 and a row decoder 12, respectively.

Memory cell array 11 is divided into a plurality of blocks MBL0–MBLn. For the sake of simplification, it is assumed that the memory cell array in one block includes memory cells of 2 rows and 2 columns in FIG. 1. For example, a memory block MBL0 includes memory cell transistors Q11–Q14, each including a floating gate and a control gate.

In memory cell array 11, data is read out from a memory cell selected according to the address signal from address buffer 13 in a read operation. In a write/erasure operation, data is written/erased with respect to the memory cell selected according to row decoder 12 and column decoder 5 under control of write/erasure control circuit 1.

Specifically, in a read operation, row decoder 12 selectively supplies a read potential to a word line selected according to the address signal from address buffer 13. Column decoder 5 receives the address signal from address buffer 13 to selectively render Y gate transistors Q1 and Q2 conductive. A sense amplifier 3 amplifies the data of the memory cell in memory cell array 11 input via Y gate transistors Q1 and Q2 to provide the amplified data to a data input/output buffer 2.

Data input/output buffer 2 provides to a data terminal DQr the data read out from memory cell array 11 and amplified by sense amplifier 3.

In a write operation, data input/output buffer 2 provides the write data applied from a data input/output terminal DQr to a write circuit 4. Column decoder 5 receives an address signal from address buffer 13 to selectively render Y gate transistors Q1 and Q2 in Y gate circuit 21 conductive. Write circuit 4 provides the data applied from data input/output buffer 2 to column latches 17 and 18. Column latches 17 and 18 latch the write data. Transfer gate 16 controls the connection between column latches 17 and 18 and the bit line. The data stored in column latches 17 and 18 are written into the selected memory cell as a result of row decoder 12 selectively supplying a write potential to the word line selected according to the address signal.

In an erasure operation, row decoder 12 selectively supplies an erasure potential to the selected word line under control of write/erasure control circuit 1.

In respective read, write and erasure operations, a source line driver 10 supplies a source potential to a memory cell transistor for each of memory blocks MBL0–MBLn via a source line SL. In other words, source lines SL0–SLn are provided for memory blocks MBL0–MBLn. Source line driver 10 controls the potential of each source line SL (the source line is generically referred to as "source line SL" hereinafter) independent of the potential of other source lines SL. For example, in a read operation, source line driver 10 applies a voltage of the ground level to source line SL of the memory block of interest. In an erasure operation and write operation, source line driver 10 receives via a distributor 20 the potential generated by a positive voltage generation circuit 19 (or, the potential generated by a negative voltage generation circuit 8) under control of write/erasure control circuit 1 to apply the received potential to source line SL of the memory block of interest.

Therefore, a "memory block" is the unit that has a common source potential applied to a plurality of memory cell transistors in that memory block, wherein the source potential is supplied independent of that of other memory blocks.

Positive voltage generation circuit 19 generates a positive voltage to be supplied to column latches 17, 18 and the like. Negative voltage generation circuit 8 generates a negative voltage that is used in a write operation and erasure operation. A word line boost circuit 6 generates a potential to be supplied to a word line.

Distributor 20 receives respective voltages from positive voltage generation circuit 19, negative voltage generation circuit 8, word line boost circuit 6 and the like to selectively supply the received voltage to row decoder 12, well potential switch circuit 15, column latches 17 and 18, and source line driver 10 according to respective operation modes.

Well potential switch circuit 15 controls the well potential of a memory cell transistor under control of write/erasure control circuit 1.

Figure 2:
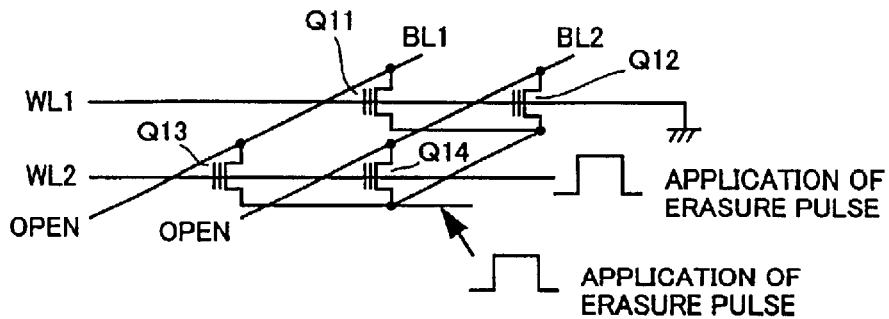
FIG. 2 is a schematic diagram of voltage application in an erasure operation according to a first embodiment.
Figure 19:
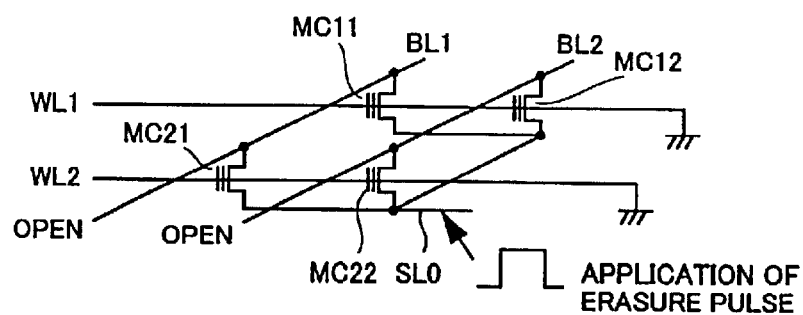
FIG. 19 is a schematic diagram to describe the voltage applied to a memory cell transistor in a memory block according to a first conventional erasure pulse application method.

FIG. 2 is a schematic diagram showing a voltage application state in an erasure operation of the first embodiment. FIG. 2 is comparable to FIG. 19 corresponding to the first conventional erasure pulse application method. In FIG. 2, memory cell transistors Q11–Q14 in memory block MBL0 are selectively depicted.

In memory block MBL0 corresponding to an erasure operation in FIG. 2, row decoder 12 selectively supplies the voltage of ground level to only word line WL1 among a plurality of word lines. Accordingly, memory cell transistors Q11 and Q12 connected to word line WL1 have their threshold voltage shifted in response to the application of an erasure pulse of, for example, a height of 10V and a width of 10 msec to source line SL0 with bit lines BL1 and BL2 in an open state.

As to word line WL2 besides word line WL1, a pulse of a positive voltage, for example a pulse of 10V in height and 10 msec in width, though not particularly limited, is applied in synchronization to the application of an erasure pulse to source line SL0. Accordingly, no shift will occur in the threshold voltages of memory cell transistors Q13 and Q14 which are connected to word line WL2.

When an erasure operation is to be applied on memory cell transistors Q13 and Q14 that are connected to word line WL2, row decoder 12 selectively sets the potential level of word line WL2 at the ground potential, and applies a pulse of a positive voltage to word line WL1.

In comparison to the conventional erasure operation in which an erasure pulse is supplied to the source line of memory cell transistors present in the block at one time and applying an erasure pulse to all word lines WL in the block at one time, application of an erasure pulse on a word line-by-word line basis allows fewer memory cells to be subjected to erasure in an erasure operation carried out in the unit of memory blocks. Therefore, variation in the threshold voltage of the memory cell transistor can be suppressed.

In other words, by controlling the erasure operation for each word line within the memory block, application of an erasure pulse can be altered for each word line. Therefore, variation in the threshold voltage can be suppressed for the entire block.

For example, erasure verification can be carried out for each word line to control whether to additionally apply an erasure pulse or not for each word line, as will be described afterwards.

Second Embodiment

Figure 3:
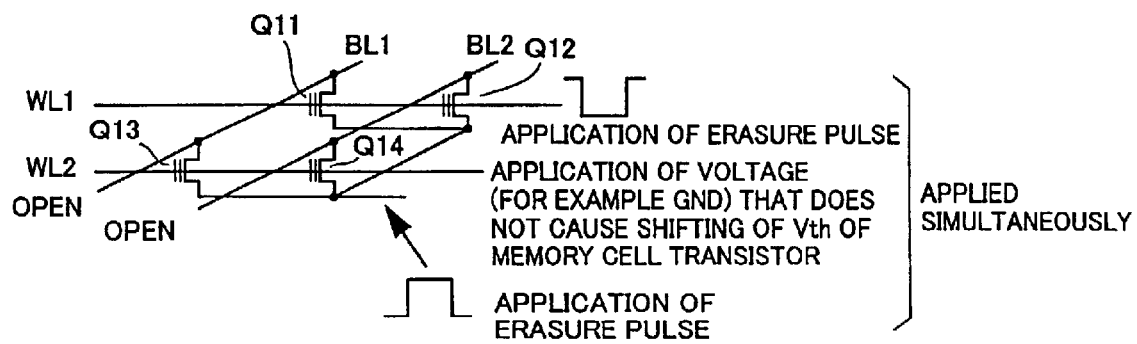
FIG. 3 is a schematic diagram to describe an erasure operation on a memory cell transistor according to a second embodiment of the present invention.
Figure 20:
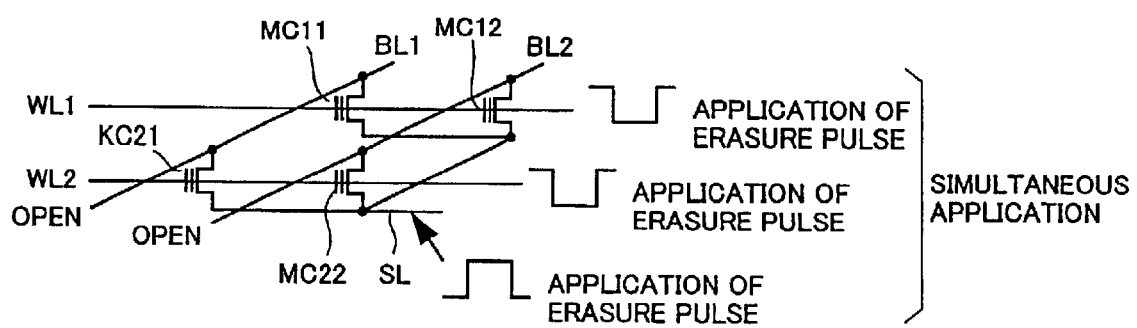
FIGS. 20 and 21 are schematic diagrams of a memory block to describe the applied voltage in a second conventional erasure pulse application method.
Figure 21:
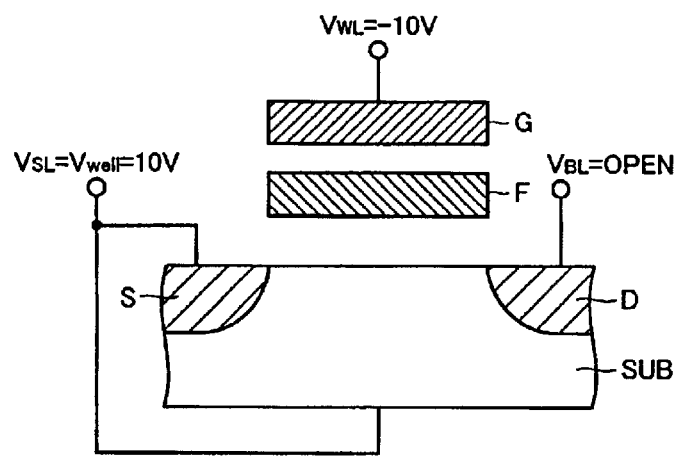

FIG. 3 is a schematic diagram to describe an erasure operation of a memory cell transistor according to a second embodiment of the present invention. FIG. 3 is comparable to FIG. 20 corresponding to the second conventional erasure method. In FIG. 3, memory cell transistors Q11–Q14 in memory cell block MBL0 of FIG. 1 are selectively illustrated.

As shown in FIG. 3, with bit lines BL1 and BL2 in an open state, an erasure pulse of a positive voltages supplied to source line SL0 provided common to the sources of the memory cell transistors in the memory block and to the substrate. Also, row decoder 12 applies an erasure pulse of a negative voltage at the same time to only word line WL1 that is to be subjected to erasure. Accordingly, the threshold voltages of memory cell transistors Q11 and Q12 connected to word line WL1 are shifted.

As the word line WL2, row decoder 12 applies a voltage of a level between the peak voltage applied to source line SL0 and the peak voltage applied to the word line, and of a level that does not cause shifting in the threshold voltage of the memory cell transistor connected to the relevant word line WL2, for example a ground potential.

Therefore, the transistors connected to word line WL2 do not have their threshold voltages shifted.

In the case where memory cell transistors Q13 and Q14 connected to word line WL2 are to be subjected to an erasure operation, the voltage applied to word line WL1 and the voltage applied to word line WL2 are to be exchanged.

By the above-described structure, the advantage similar to that of first embodiment can be obtained.

Third Embodiment

Figure 4:
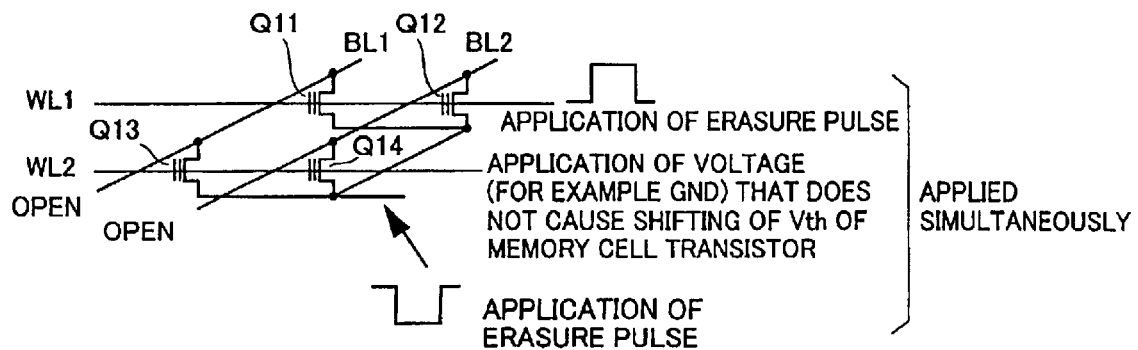
FIG. 4 is a schematic diagram to describe a method of erasure pulse application according to a third embodiment of the present invention.
Figure 22:
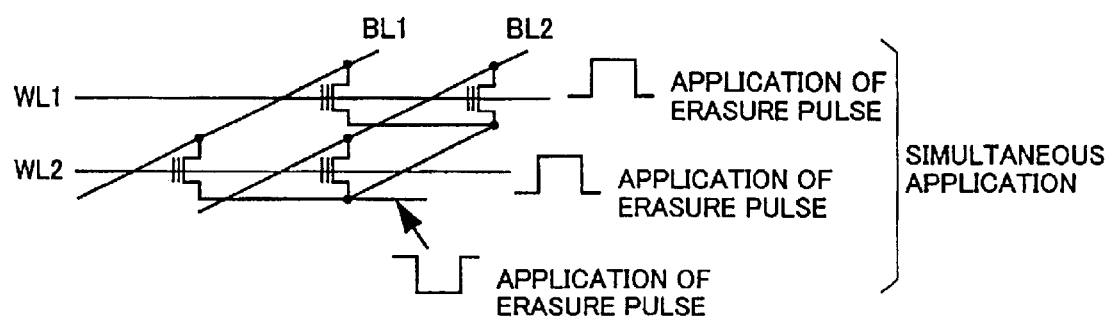
FIG. 22 is a schematic diagram to describe the voltage applied to a memory cell transistor in a third conventional erasure pulse application method.
Figure 23:
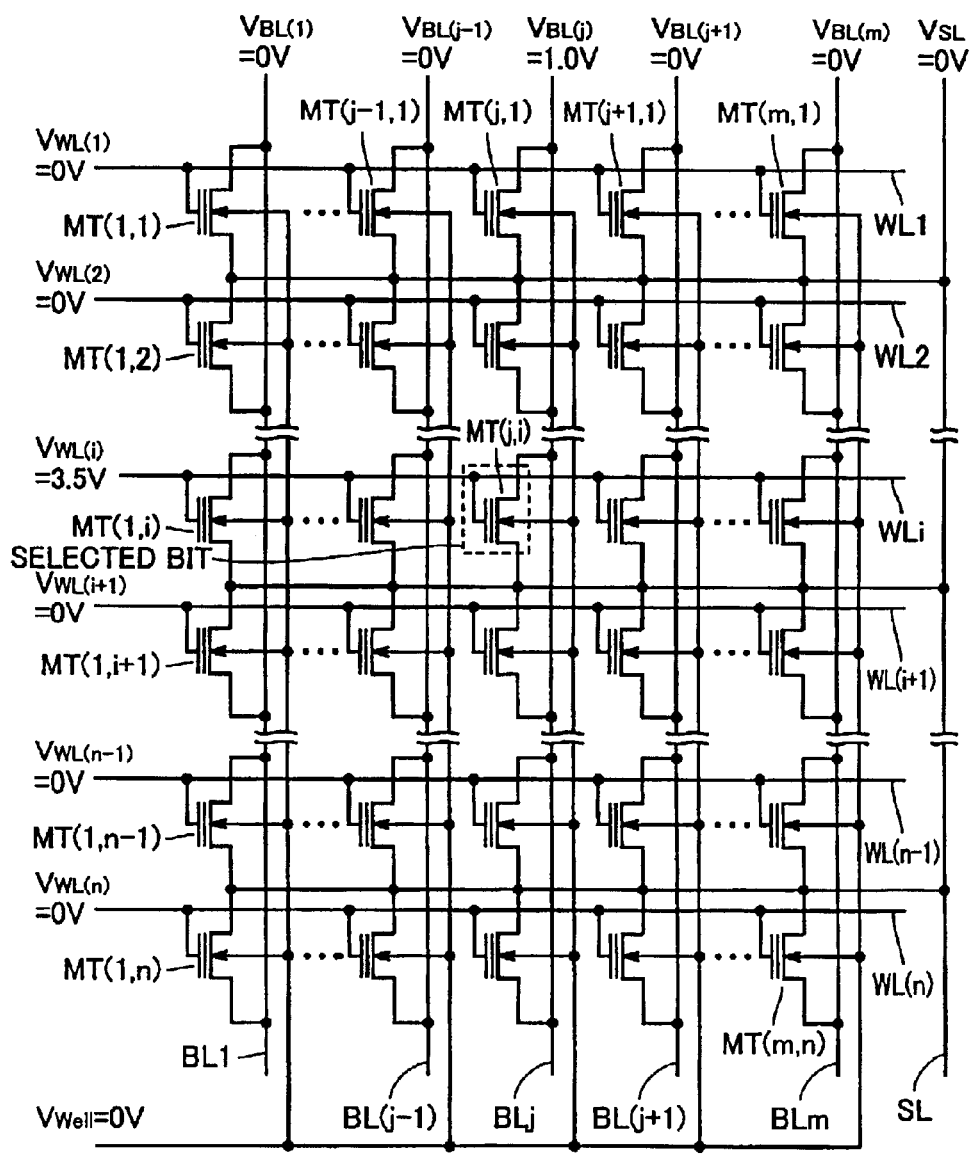
FIG. 23 is a diagram to describe the voltage applied to a memory cell transistor in an erasure verification mode.
Figure 24:
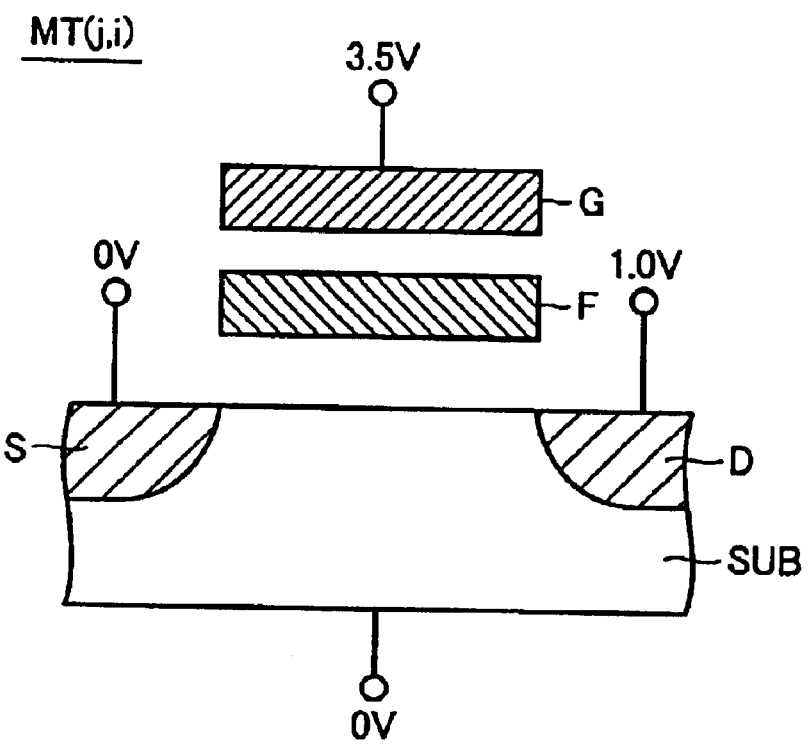
FIG. 24 shows the voltage applied to the memory cell transistor corresponding to the selected bit in FIG. 23.
Figure 25:
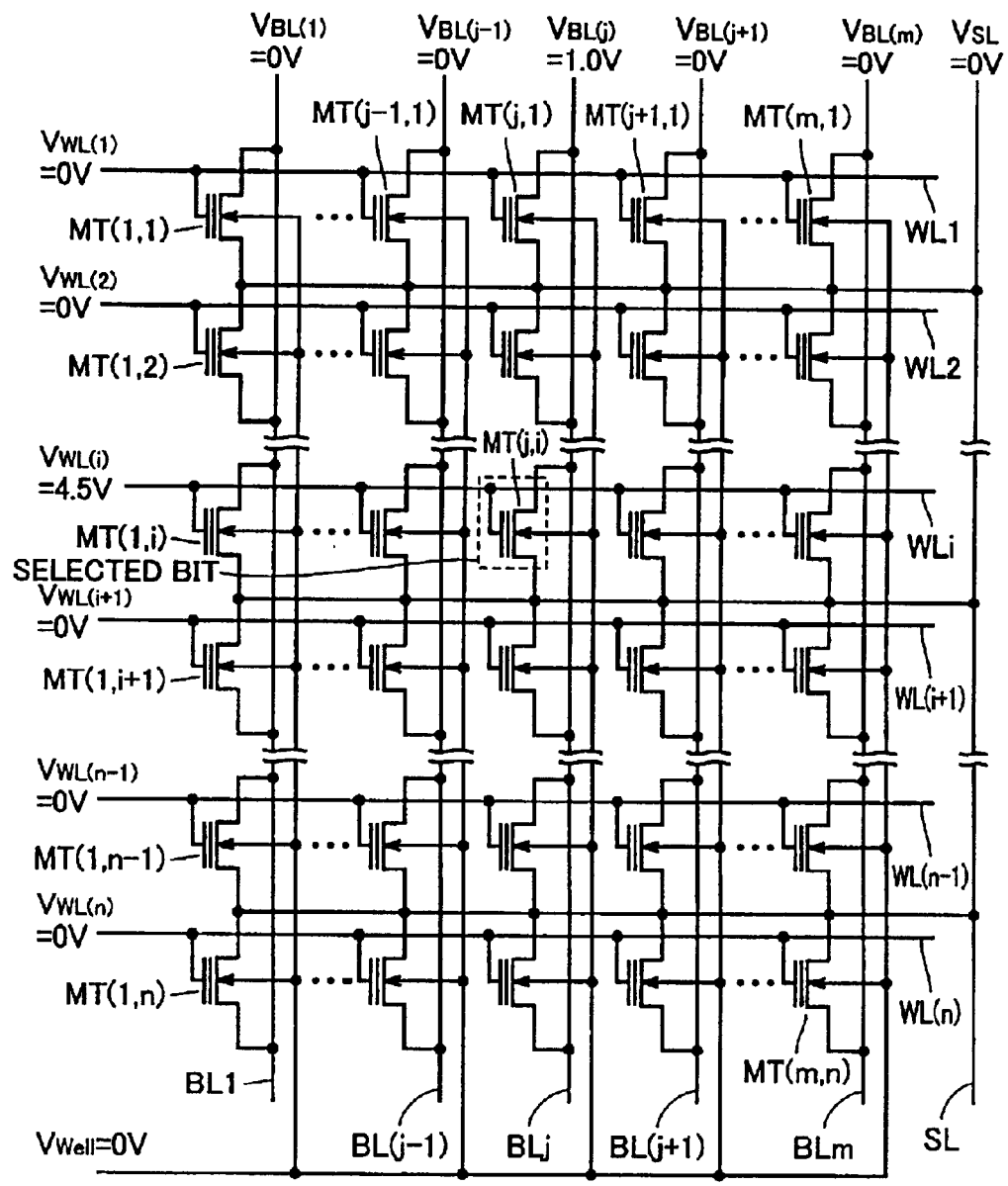
FIG. 25 is a circuit diagram to describe voltage setting in a read operation of a conventional flash memory.
Figure 26:
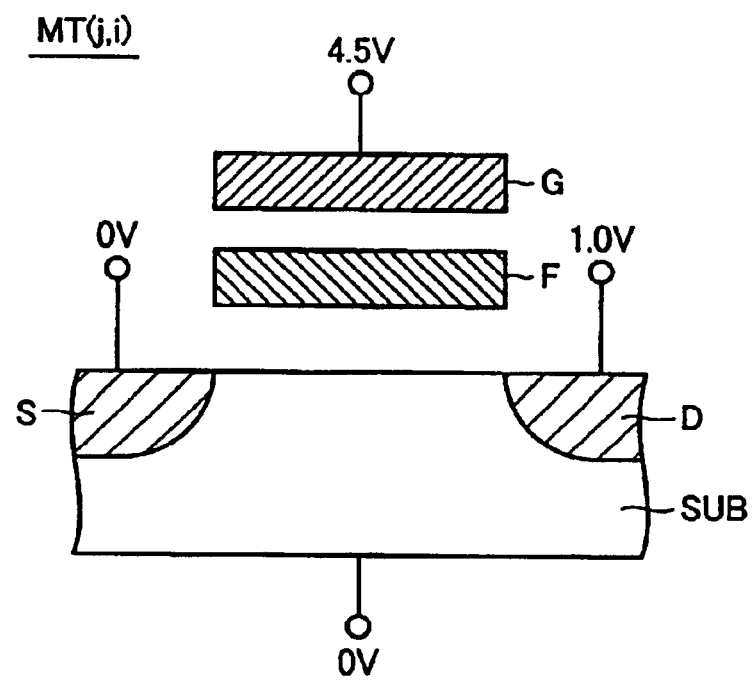
FIG. 26 shows the potential applied to a selected memory cell transistor in a read mode of FIG. 25.

FIG. 4 is schematic diagram to describe an erasure pulse application method according to a third embodiment of the present invention. FIG. 4 is comparable to FIG. 22 corresponding to the third conventional erasure pulse application method. In FIG. 4, memory cell transistors Q11–Q14 in memory cell block MBL0 in FIG. 1 are selectively depicted.

Referring to FIG. 4, an erasure pulse of negative voltage is applied to source line SL0 provided common to all the memory cells in the block and to the substrate. Also, in synchronization, an erasure pulse of a positive voltage is applied to the word line that is to be subjected to erasure, for example, word line WL1. Thus, the threshold voltages of memory cell transistors Q11 and Q12 coupled to word line WL1 are shifted.

As to word line WL2, a voltage of a level between the peak voltage applied to source line SL0 and the peak voltage applied to the word line, and of a level that does not cause shifting in the memory cell transistors connected to word line WL2, a ground potential, for example, is applied.

By applying an erasure pulse selectively for each word line even in the case where an erasure operation is carried out in a block unit, variation in the threshold voltage after erasure on the block can be suppressed. Advantages similar to those of the first embodiment can be obtained.

In the above first to third embodiments, voltage application in an erasure mode is not limited to the above-described conditions of the voltage application as long as a potential difference that causes shifting in the threshold voltage of the memory cell transistor can be applied.

In other words, by allowing application of different potential differences between the word line that is to be subjected to an erasure operation and the word line that is not subjected to an erasure operation, a structure can be implemented where electrons are injected or drown out by applying a potential that causes an erasure operation between the floating gate and source, between the floating gate and drain, between the floating gate and substrate, or between the floating gate and gate.

Fourth Embodiment

Following the application of an erasure pulse as in the above-described first to third embodiments, a verification operation can be effected on a word line-by-word line basis in order to confirm that the threshold voltage of the memory cell transistor is at least a determined threshold voltage level (or, below a determined threshold voltage level according to the erasure mode) to identify an erased status. In this case, the erasure operation is repeated so that the threshold voltage of the memory cell transistor attains a desired value.

Figure 5:
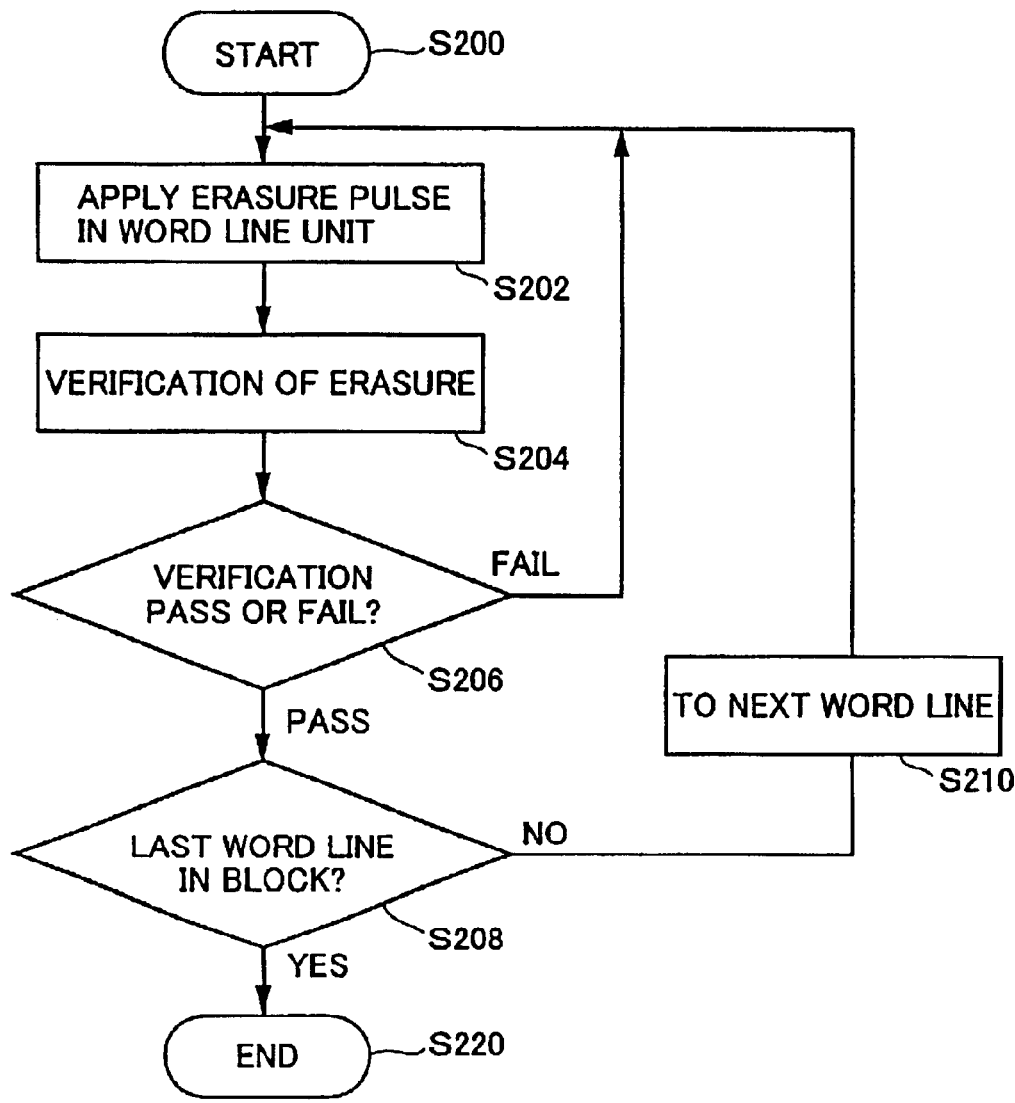
FIG. 5 is a flow chart of an erasure flow of a fourth embodiment.

FIG. 5 is a flow chart of an exposure flow of such a fourth embodiment.

Referring to FIG. 5, at the start of an erasure operation (step S200), an erasure pulse is supplied for every word line (step S202).

Then, a verification operation is carried out in a word line unit (step S204).

When determination is made that erasure is insufficient at the erasure verification for each word line (step S206), the erasure pulse is applied again in a word line unit (step S202).

When determination is made that the erasure operation for a word line has ended as a result of the verification for every word line at step S206, determination is then made whether the currently-processed word line is the last word line within the memory block subjected to erasure (step S208).

When the process has not arrived at the last word line, the process is transferred to the next word line (step S210). Transition is made to the erasure pulse apply operation for every word line of step S206 again.

When determination is made that the current word line is the last word line in the erasure block at step S208, the erasure operation for that memory block ends (step S220).

In other words, when erasure is effected in a word line unit as in the above first to third embodiments, an erasure operation and verification operation for each selected word line are repeatedly executed until the threshold voltage of the memory cell transistor attains an erased state. Control proceeds to the erasure of the next word line when the verification is successful, i.e., the verification result corresponds to "pass" following the erasure operation and verification operation in the word line unit.

By such an erasure method, application of an erasure pulse can be altered for each word line. Therefore, variation in the threshold voltage can be suppressed for the entire block.

The conventional erasure verification operation was effected on a word-by-word basis or a bite-by-bite basis as to the memory cell transistors connected to the same word line. Thus, there is an advantage that the time required for verification can be reduced by the erasure operation shown in FIG. 5. Furthermore, erasure and verification can be effected integrally by carrying out the verification in a word line unit since the erasure is effected in a word line unit.

Fifth Embodiment

The above description is directed to the method of applying an erasure pulse in a word line unit. In the case where the word lines are divided, application of an erasure pulse in the unit of the divided word lines allows the threshold voltages of the memory cell transistors to be controlled more evenly since the number of memory cell transistors that are to be applied an erasure pulse at the same time is reduced.

The nonvolatile semiconductor memory device of the present embodiment has the word lines divided. The structure is similar to nonvolatile semiconductor memory device 1000 of FIG. 1 provided that row decoder 12 controls the potential of the divided word lines.

Figure 6:
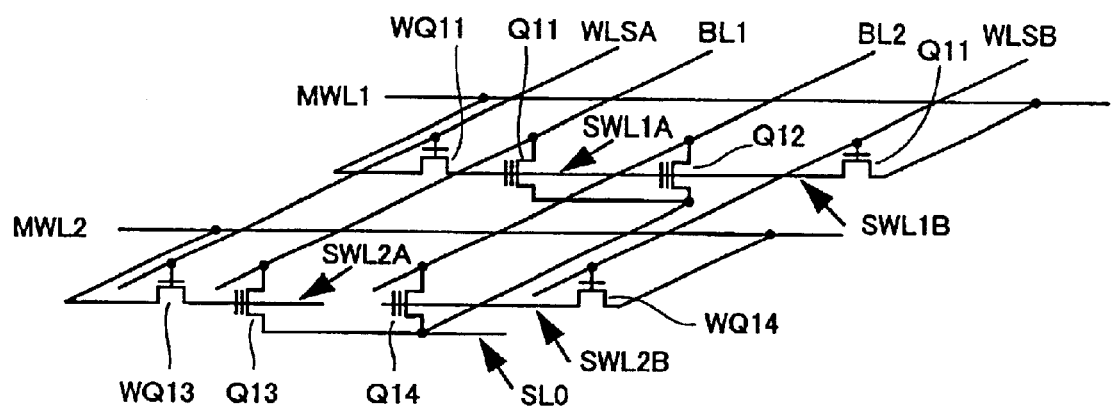
FIG. 6 is a circuit diagram showing a structure of divided word lines.

FIG. 6 is a circuit diagram showing a structure of such divided word lines.

Row decoder 12 selectively supplies an erasure potential to sub word lines SWL1A, SWL1B or SWL2A, SWL2B via respective transistors WQ11–WQ14 selected by word line select signals WLSA and WLSB from main word lines MWL1 and MWL2.

Source line SL0 is provided in common within the same erasure block MBL0. Therefore, memory cell transistors Q11–Q13 belong to the same memory block MBL0 here.

An erasure pulse is applied as described in the first to third embodiments similarly to source line SL0 and sub word lines SW1A–SW2B.

The structure of FIG. 6 has one memory cell transistor provided corresponding to one sub word line. A structure in which a plurality of memory cell transistors are provided for one sub word line can be also provided.

In the present case where the word lines are divided, an erasure operation and verification can be also carried out in the unit of the divided word lines.

In this case, an erasure operation and verification are repeated until the threshold voltage of the memory cell transistor attains an erased state in combination with the erasure pulse application in the word line unit.

The number of memory cell transistors to which an erasure pulse is applied will correspond to a smaller unit in comparison to the case where the word line is not divided. Therefore, the threshold voltage of the memory cell transistor can be controlled more evenly in the memory block.

Sixth Embodiment

Figure 7:
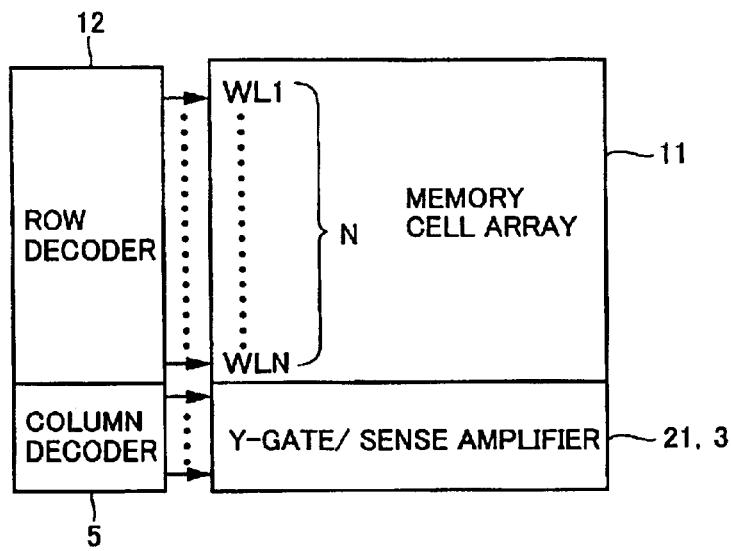
FIG. 7 is a schematic diagram showing a structure of a memory cell array 11, a row decoder 12, a column decoder 5, a Y select gate circuit 21 and a sense amplifier 3.

FIG. 7 is a schematic diagram showing memory cell array 11, row decoder 12, column decoder 5, and a Y select gate circuit 21 and a sense amplifier 3 in a nonvolatile semiconductor memory device 1000 as described in the above first FIGS. 1–6.

Figure 8:
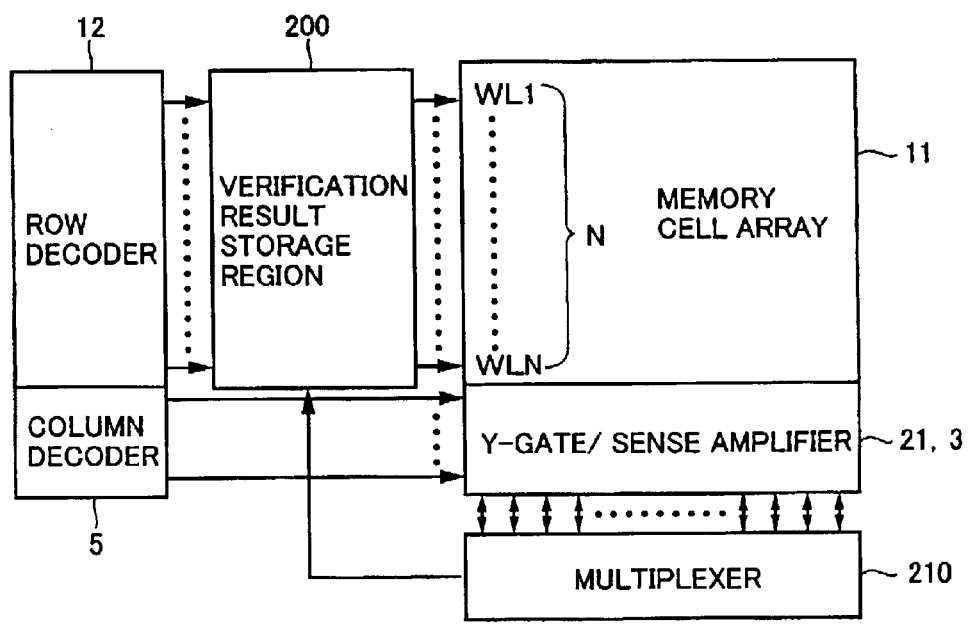
FIG. 8 is a schematic block diagram of memory cell array 11 and a structure for selection thereof according to a sixth embodiment of the present invention.

FIG. 8 is a schematic block diagram showing a structure of memory cell array 11 according to the sixth embodiment of the present invention and selection for a memory cell.

In the sixth embodiment, a verification result storage region 200 is provided between memory cell array 11 and row decoder 12. Verification result storage region 200 stores the result of verification to confirm the erased state on a word line-by-word line basis. The verification result detected by sense amplifier 3 is stored in verification result storage region 200 via a multiplexer 210.

In the nonvolatile semiconductor memory device of the sixth embodiment, an erasure pulse is supplied selectively and at one time to respective word lines among the plurality of word lines corresponding to the row of memory cells having a memory cell transistor that is not erased sufficiently according to the value stored in verification result storage region 200.

According to the structure shown in FIG. 8 the verification result of one word line is read out. When all the memory cells connected to that one word line attain an erased state, "1" is stored in verification result storage region 200 corresponding to the verified word line.

"0" (initial value) is stored if at least one memory cell coupled to the relevant one word line is not erased.

Figure 9:
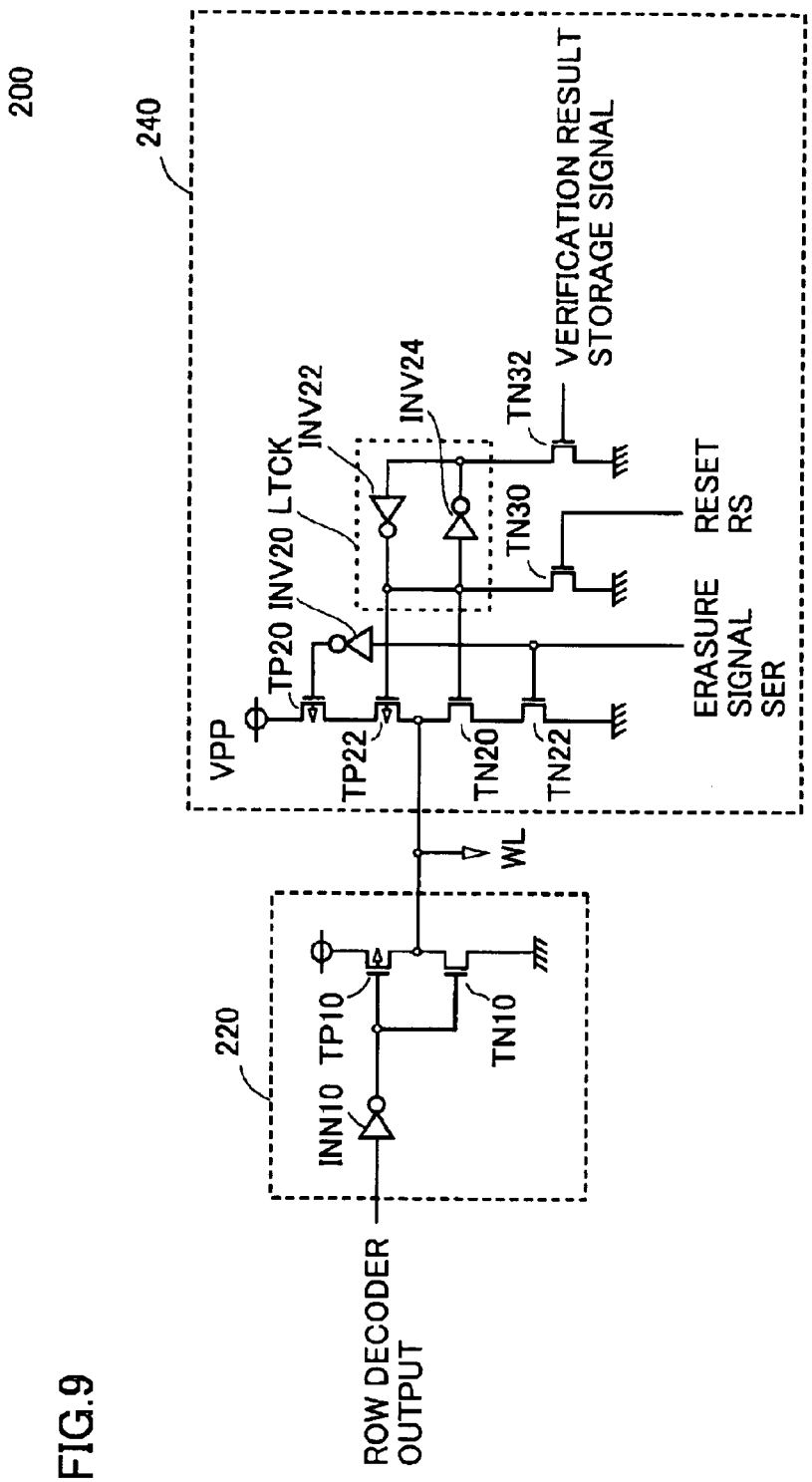
FIG. 9 is a circuit diagram showing a structure of a verification result storage region 200.

FIG. 9 is a circuit diagram showing a structure of verification result storage region 100.

Verification result storage unit 200 includes a drive unit 220 to drive the potential of the word line according to a signal from row decoder 12, and an erasure pulse apply control unit 240. This drive unit 220 and erasure pulse apply control unit 240 are provided for every word line.

Drive unit 220 includes an inverter INV10 receiving and inverting the output of row decoder 12, and a P channel MOS transistor TP10 and an N channel MOS transistor TN10 provided, for example, between a boosted potential Vpp applied to word line WL and ground potential Vss in an erasure operation, and receiving the output of inverter INV10 at respective gates. A connection node between transistors TP10 and TN10 are coupled to word line WL.

Erasure pulse apply control unit 240 includes P channel MOS transistors TP20 and TP22 and N channel MOS transistors TN20 and TN22 connected in series between a boosted potential Vpp applied to word line WL in, for example, an erasure operation, and ground potential Vss. Transistor TN22 receives an erasure signal SER from write/erasure control unit 1 at its gate. Transistor TP20 receives a signal that is an inverted version of signal SER by inverter INV20 at its gate.

Erasure pulse apply control unit 240 further includes a latch circuit LTCK controlling the gate potentials of transistors TP22 and TN20.

Latch circuit LTCK includes an inverter INV22 having its output coupled to the gate of transistor TP22, and an inverter INV24 having its input node coupled to the output of the inverter INV22 and its output node coupled to inverter INV22. Inverter INV24 has its input node coupled to the gate of transistor TN20.

Erasure pulse apply control unit 240 further includes an N channel MOS transistor TN30 connected between the input node of inverter INV24 and ground potential Vss, rendered conductive in response to a reset signal RS from write/erasure control unit 1, and an N channel MOS transistor TN32 connected between the input node of inverter INV22 and ground potential Vss, rendered conductive according to a verification result storage signal applied from write/erasure control unit 1 according to the verification result.

Latch circuit LTCK is initially stored with "0" (initial value). Transistors TP22 and TN20 are applied with an L level at their gates. Latch circuit LTCK stores "1" when all the memory cells coupled to a corresponding one word line attain an erased state according to the verification result of the corresponding word line, and applies an H level to the gates of transistors TP22 and TN20. Therefore, in the case where "1" is stored in latch circuit LTCK, an erasure pulse of level Vpp will not be applied to word line WL even if transistor TP10 is rendered conductive in response to the output of row decoder 12 after signal SER attains an active state (H level).

In storing a verification result by the circuit shown in FIG. 9, it is postulated that the threshold voltage of the memory cell transistor is shifted when a voltage Vpp is applied to word line WL.

Figure 10:
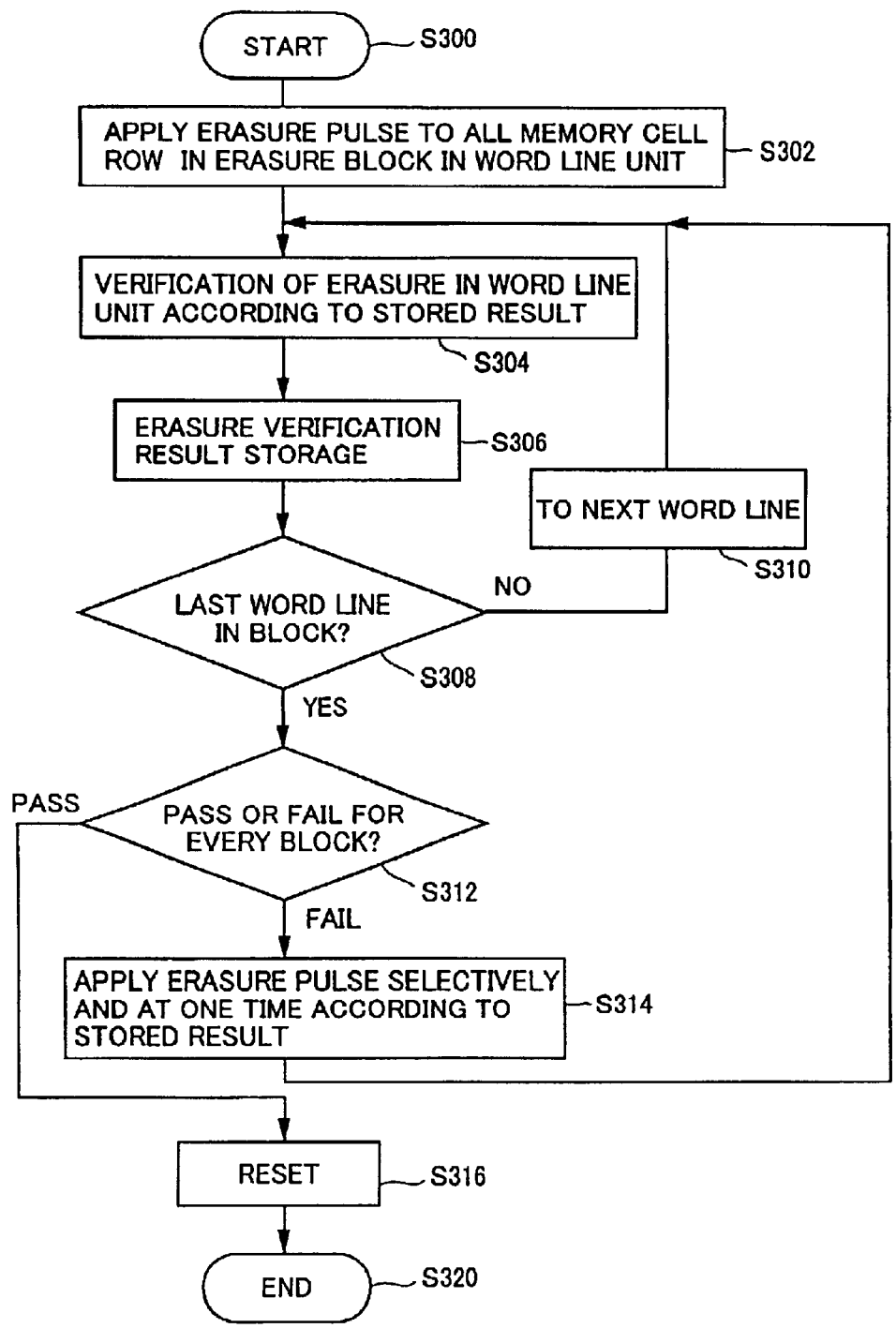
FIG. 10 is a flow chart of the process carried out in an erasure operation using a drive unit 220 and an erasure pulse application control unit 240.

FIG. 10 is a flow chart of the process carried out in an erasure operation using drive unit 220 and erasure pulse supply control unit 240 of FIG. 9.

As the initial state, verification result storage region 200 stores "0" corresponding to all word lines by a reset signal RS.

When an erasure operation is initiated (step S300), an erasure pulse is applied to all the memory cell rows in the erasure block on a word line-by-word line basis. Since verification result storage region 200 stores "0" corresponding to the all the word lines, erasure is executed since a desired potential is supplied to word line WL when the output of row decoder 12 is pulled up to an H level (selected state) from an L level.

Verification is executed on a word line-by-word line basis for all word lines that do not have erasure completed according to the information stored in verification result storage region 200 (step S304). When all the memory cell transistors on the word line WL subjected to erasure attains an erased state, a pulse of an H level is output as the verification result output signal. "1" is stored in latch circuit LTCK corresponding to word line WL in verification result storage region 200 (step S306).

Then, determination is made whether the relevant word line is the last word line in the erasure block (step S308). When the relevant word line is not the last word line, the object of verification is transferred to the next word line (step S310), and control proceeds to step S304.

When verification has been completed for the final word line (step S308), determination is made whether all the word lines have passed the erasure verification in the erasure block (step S312).

When all the word lines in the erasure block have not passed the erasure verification, an erasure pulse is supplied selectively and at one time according to the storage result (step S314). In other words, even if the output of the row decoder 12 attains a selected state with the verification result stored in verification result storage region 200, erasure signal SER is rendered active when "1" is stored as the verification result. Transistor TN22 is rendered conductive, and transistor TN20 is also rendered conductive according to the data stored in latch circuit LTCK. Therefore, the desired potential will not be applied to word line WL. Thus, the threshold voltage of the memory cell transistor connected to word line WL will not be shifted.

Following application of an erasure pulse (step S314), control returns to step S304.

When all the word lines in the erasure block have passed the erasure verification at step S312, the information stored in verification result storage region 200 is reset (step S316). The erasure operation for the relevant block ends (step S320).

By the above-described structure, a reset signal is output when all the memory cell transistors in the erasure block attain an erased state, whereby verification result storage region 200 is reset to the initial state.

Accordingly, there is an advantage that the time required to subject the relevant block entirely to erasure can be reduced than that of the case where the erasure pulse application and verification operation are carried out for every word line.

Figure 11:
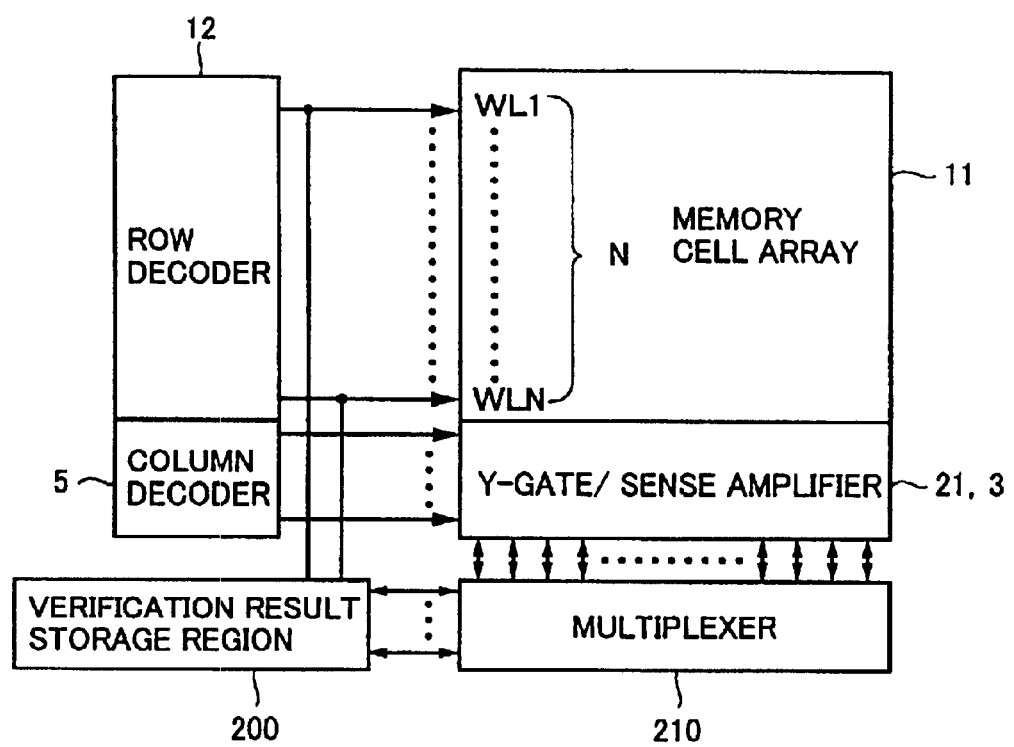
FIG. 11 shows another arrangement of verification result storage region 200.

FIG. 11 shows another example of the arrangement of verification result storage region 200.

Referring to FIG. 11, verification result storage region 200 is provided in a region other than the region between row decoder 12 and memory cell array 11.

The above description is based on a structure in which an erasure pulse is applied or not applied according to the value stored in a region 200 that stores the verification result on a word line-by-word line basis. Determination is also made of whether to execute an erasure verification or not according to the stored value. A structure can also be implemented in which erasure verification is always carried out for all the word lines in the erasure block, and only the application of an erasure pulse is carried out in a word line unit according to the information stored in region 200.

In the case where erasure verification is carried out according to the information stored in verification result storage region 200, the stored value is 0 when the erasure verification fails and the stored value is 1 when the erasure verification indicates "pass". Erasure verification is to be carried out for only the word line corresponding to the stored value of the "0" level following application of an erasure pulse. As a result, verification is not required for the word line that has erasure completed. Thus, the erasure operation can be increased in speed.

[Modification of Sixth Embodiment]

According to a modification of the sixth embodiment, the verified result of one word line is stored in the address unit (for example, 32 results when there are 32 addresses for one word line). When verification is to be carried out again after applying an erasure pulse in a word line unit, verification is effected on only the addresses that exhibited failure in the previous verification according to the value stored in the address unit. In other words, by determining whether to carry out verification or not for every plurality of bits read out by one address, the erasure operation can be carried out more speedily.

Seventh Embodiment

In the previous sixth embodiment, an erasure pulse is supplied selectively at one time to a plurality of word lines WL corresponding to memory cell transistors that are not erased sufficiently according to a stored value. Alternatively, an erasure pulse can be applied sequentially to a plurality of word lines including a memory cell transistor that is not erased sufficiently according to a stored value.

Figure 12:
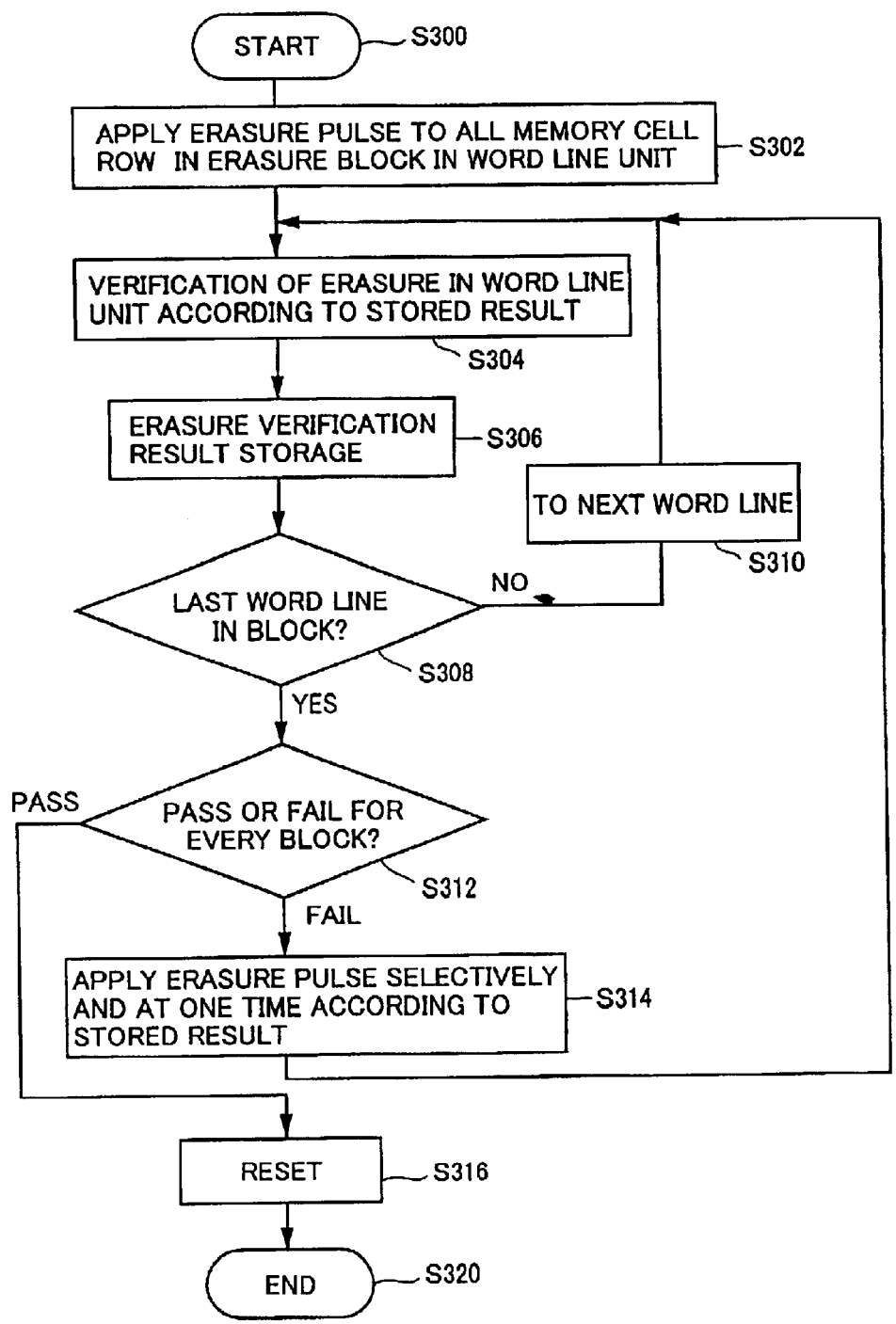
FIG. 12 is a flow chart of the process carried out according to a seventh embodiment.

FIG. 12 is a flow chart of the process carried out by such a seventh embodiment.

The flow chart of FIG. 12 corresponding to the seventh embodiment is similar to the flow chart of FIG. 10 corresponding to the sixth embodiment provided that a step S314' is carried out instead of step S314. The remaining steps are similar to those of FIG. 10, so that description thereof will not be repeated.

As step S314', an erasure pulse is sequentially applied on a word line-by-word line basis under control of write/erasure control circuit 1 according to the stored verification result.

In the seventh embodiment, verification result storage region 200 may have a structure similar to that shown in FIG. 9. Alternatively, verification result storage region 200 may be absent of transistors TP20–TN22 and inverter INV20, and include latch circuit LTCK to store the verification result and transistors TN30 and TN32. A structure that can store and read out the verification result is allowed.

Such a structure provides a similar advantage of reducing the time required to subject the block entirely to erasure in comparison to the case where erasure pulse application and verification operation are carried out for every word line.

Eighth Embodiment

The previous sixth embodiment corresponds to the method of applying an erasure pulse additionally according to the verified result carried out on a word line-by-word line basis.

The present eighth embodiment is directed to a structure in which the block of interest is subjected to one-time erasure, followed by determination of the erasure block level, and applying an erasure pulse at one time to the word line including a memory cell transistor that is not erased sufficiently, or sequentially applying an erasure pulse selectively.

In general, variation in the threshold voltage of the memory cell transistor is controlled by applying an erasure pulse for a plurality of times with different potential differences and time instead of shifting the threshold voltage of a memory cell transistor to an erasure level by one erasure pulse application in the erasure operation.

If erasure in the word line unit is to be carried out one word line at a time from the start, a period of time corresponding to (the erasure time of 1-time erasure)× the number of word lines will be required for the erasure operation. This is time-consuming.

In the present eighth embodiment, an erasure pulse is supplied at one time in the erasure block unit until attaining an erased state of a certain level. Then the erasure operation is switched to a word line unit.

Figure 13:
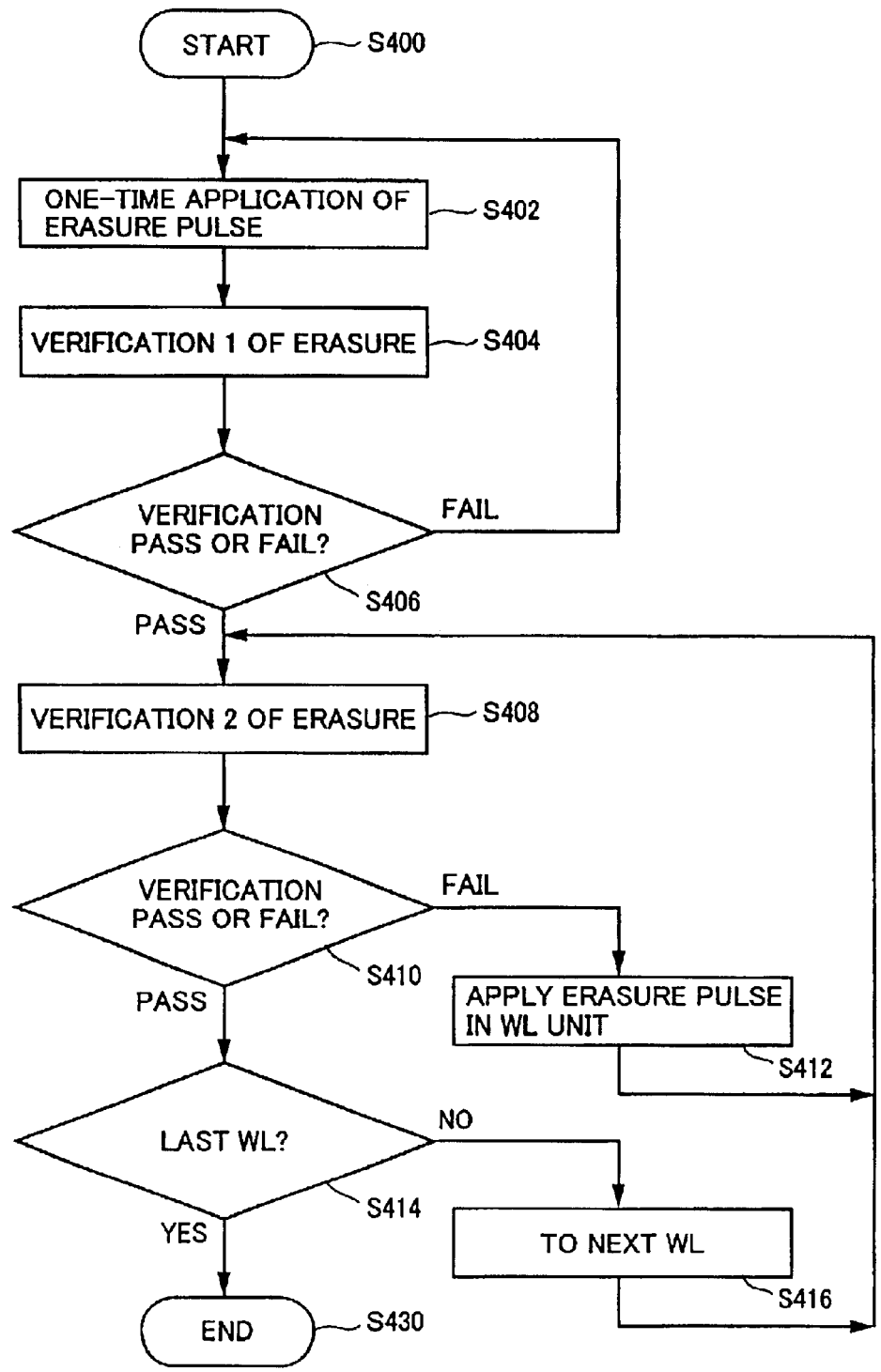
FIG. 13 is a flow chart to describe an erasure flow according to an eighth embodiment.

FIG. 13 is a flow chart to describe the erasure flow of the eighth embodiment. This process is carried out on, for example, nonvolatile semiconductor memory device 1000 shown in FIG. 1.

Referring to FIG. 13, upon initiation of an erasure operation (step S400), an exposure pulse is applied at one time to the entire exposure block (step S402).

With respect to the one-time application of an exposure pulse, a first verification potential is applied to the word line for the first erasure verification (step S404). Determination is made whether the verification passes/fails (step S406).

When determination is made that the verification result indicates insufficiency, control returns to step S402. When the first verification indicates "pass", a second verification potential is supplied for every word line to effect a verification operation in the word line unit (step S408). Here, the second verification potential is lower than the first verification potential.

When determination is made that erasure is sufficient in the erasure verification for every word line (step S410), an erasure pulse is applied in a word line unit (step S412).

Following application of an erasure pulse in the word line unit, control returns to step S408. An erasure verification is carried out for every word line.

When determination is made that the erasure operation for the word line has ended as a result of the verification for every word line at step S410, determination is then made whether the currently-processed word line is the last word line in the erasure block (step S414).

When the process has not arrived at the last word line, the process is transferred to the next word line (step S416). Control proceeds to the second erasure verification operation for every word line of step S408.

When determination is made that the current word line is the last word line in the erasure block at step S414, the erasure operation ends (step S430).

By such a process, erasure on a word line-by-word line basis can be carried out sequentially with respect to word lines with insufficient erasure. Although the time required for erasure increases than that where the entire erasure process is carried out at one time, variation in the threshold voltage of the memory cell transistor can be suppressed.

Figure 14:
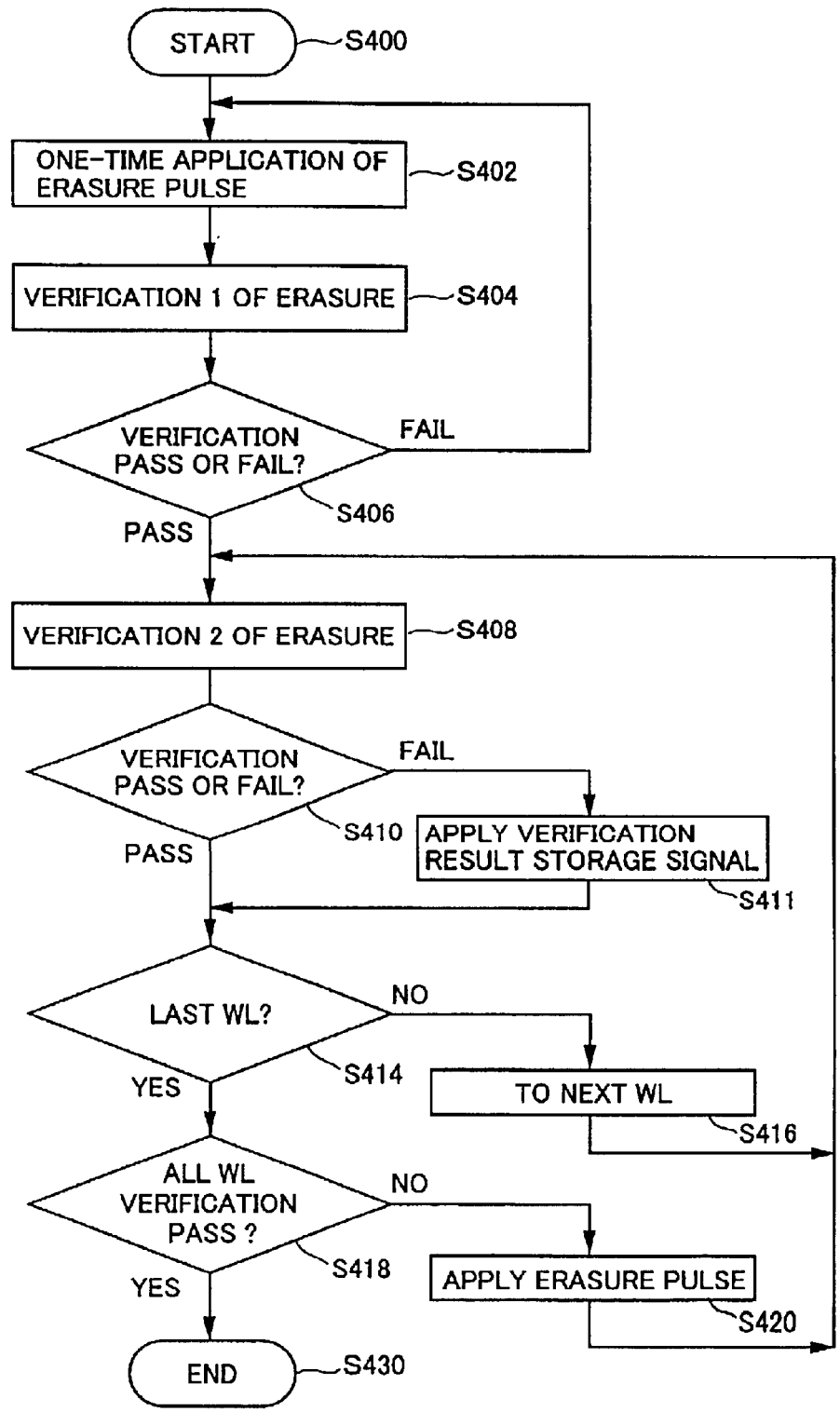
FIG. 14 is a flow chart to describe another configuration of erasure verification.

FIG. 14 is a flow chart to describe another structure of erasure verification. This process is carried out on, for example, the nonvolatile semiconductor memory device shown in FIGS. 8 or 11.

Referring to FIG. 14, the one-time erasure pulse application of step S406 and the process up to one-time verification are similar to those of FIG. 13.

At step S406, when determination is made that all the memory cells have reached a predetermined first verification voltage level after the one-time application of an erasure pulse to the entire erasure block, erasure verification for every word line based on the second verify voltage level is carried out (step S408).

Then, determination is made whether the verification result for the relevant word line indicates pass or failure (step S410). In the case where the verification result indicates "pass", a verification result storage signal is applied. The verification result is stored in verification result storage region 200 (step S411). Then control proceeds to step S414. In contrast, when the verification result indicates failure at step S410, control proceeds to step S414 to determine whether the relevant word line is the last word line in the erasure block. When the current word line is not the last word line, the process proceeds to the next word line (step S416). Control returns to step S408, and erasure verification is carried out for every word line.

When determination is made that the process has arrived to the last word line at step S414, then determination is made whether verification has been completed for all the word lines in the erasure block. When determination is made that the verification for all the word lines has not passed (step S418), an erasure pulse is supplied at one time selectively to only the word lines with insufficient erasure (step S420). After the erasure pulse application, control returns to step S408.

When determination is made that the erasure verification for all the word lines in the erasure block indicates "pass" at step S418, the erasure operation ends (step S430).

By such a structure, variation in the threshold voltage of the memory cell transistor in the erasure block can be suppressed while the time required for erasure hardly differs from that of the one-time erasure in the erasure block unit.

In the eighth embodiment of the present invention, the level of the first verification voltage required to determine whether to carry out one-time erasure or not is set higher than the verification voltage level used in the word line unit (when attaining an erased state by lowering the threshold voltage of the memory cell transistor), or is set lower (when attaining an erased state by increasing the threshold voltage of the memory cell transistor). Accordingly, variation in the threshold voltage of the memory cell transistor can be further suppressed.

In other words, in the case where an erased state is attained by reducing the threshold voltage of the memory cell transistor, determination that the memory cell transistor has arrived at the erasure level will inhibit any one-time erasure for the erasure block thereafter. Erasure and verification in the word line unit are effected.

The threshold voltage of the memory cell transistor in the transition from one-time erasure to erasure verification in the word line unit is lower than the erasure determination level of one-time erasure.

Figure 15:
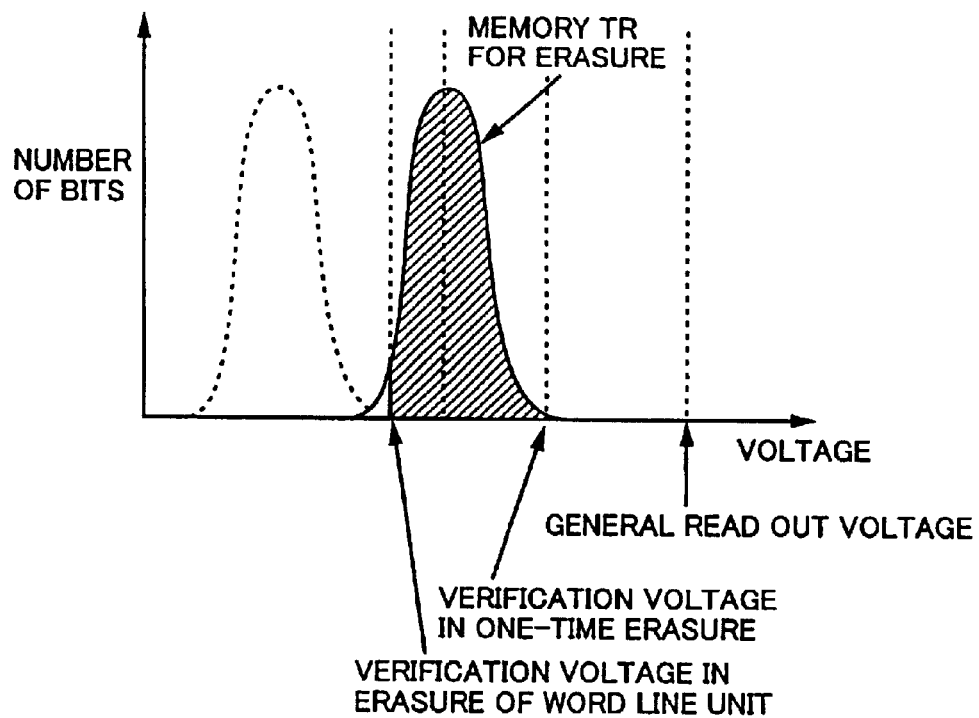
FIG. 15 is a schematic diagram of a threshold voltage distribution of memory cell transistors in an erasure block at the transition of one-time erasure to erasure verification in a word line unit.

FIG. 15 is a schematic diagram showing the threshold voltage distribution of the memory cell transistors in the erasure block at the transition from one-time erasure to erasure verification in the word line unit.

As shown in FIG. 15, most of the memory cell transistors after one-time erasure must be subjected to erasure additionally (hatched portion in FIG. 15).

Since additional erasure is carried out in the word line unit, an erasure pulse is applied to fewer memory cell transistors than in the case where all the memory cell transistors are subjected to one-time erasure. Therefore, additional erasure pulse will not be applied to a memory cell transistor of a level lower than the read out voltage during verification (erased state).

This means that any memory cell transistor that is to be subjected to additional erasure will have the threshold voltage gradually shifted until the memory cell transistor become lower than the read out voltage of the verification value. Therefore, control can be provided so that variation in the threshold voltage of the memory cell transistor is further suppressed.

Figure 16:
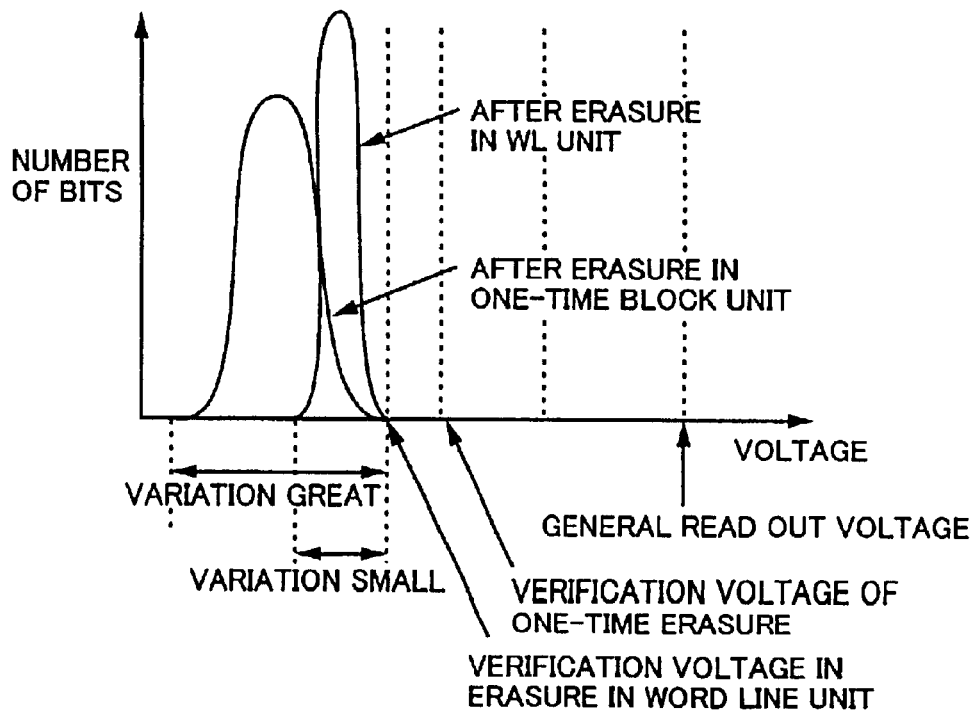
FIG. 16 shows the threshold voltage distribution of memory cell transistors in an erasure block.

FIG. 16 shows a comparison of the threshold voltage distribution of the memory cell transistor in the erasure block corresponding to the case where the verify voltage of one-time erasure is higher than the verification voltage of the erasure in the word line unit, and additional erasure is carried out in the word line unit, and the case where the entire application of the erasure pulse is carried out at one-time for the entire block.

It is appreciated from FIG. 16 that the distribution of the threshold voltage can be further suppressed by applying erasure pulse additionally in the word line unit.

Ninth Embodiment

In the previous eighth embodiment, one-time application of an erasure pulse is interrupted by a verification operation for all the transistors in the exposure block, followed by transition to a verification operation for every word line.

In the present ninth embodiment, determination of the erasure level is based only on the threshold voltage of a plurality of memory cell transistors selected as the representative bit.

Although the representative bit is not particularly restricted, the representative bit may be, for example, a plurality of bits read out at one time by one read out operation.

Therefore, when the threshold voltage of the memory cell transistors selected as representative bits is at least (or below) the determination threshold voltage to determine an erased state as steps S404 and S406 in FIGS. 13 or 14, one-time erasure is inhibited and verification in the word line unit is carried out. Then, erasure pulse is supplied at one time or sequentially in a selective manner to word lines with insufficient erasure.

Not all the word lines are sequentially verified from the beginning. The entirety is set to an erasure of a certain level, and then verification is carried out sequentially for all the word lines. Thus, the time required for erasure can be reduced corresponding to the skipped number of times of verification.

In the erasure verification method based on representative bits, one-time erasure may be ended when all the N (N: natural number) bits set as the representative bits attain a level of at least (or below) the determination threshold voltage. Alternatively, the one-time erasure may be ended when a predetermined number, for example, N/2 bits, among the N representative bits, attain a level of at least (or below) the determination threshold voltage.

In the ninth embodiment, the verification voltage for determination as to the erasure level of the representative bits is set lower (when attaining an erased state by reducing the threshold voltage of the memory cell transistor) or higher (when attaining an erased state by increasing the threshold voltage of the memory cell transistor) than the verify voltage used for erasure in the word line unit.

By such a structure, the number of times of erasure and verification in the word line unit can be reduced. Accordingly, high speed erasure operation is allowed.

Upon determination that the respective bits have arrived at the erasure level in the case where an erased state is attained by reducing the threshold voltage of the memory cell transistor, one-time erasure is subsequently inhibited for the erasure block. Erasure and verification in the word line unit are carried out.

Figure 17:
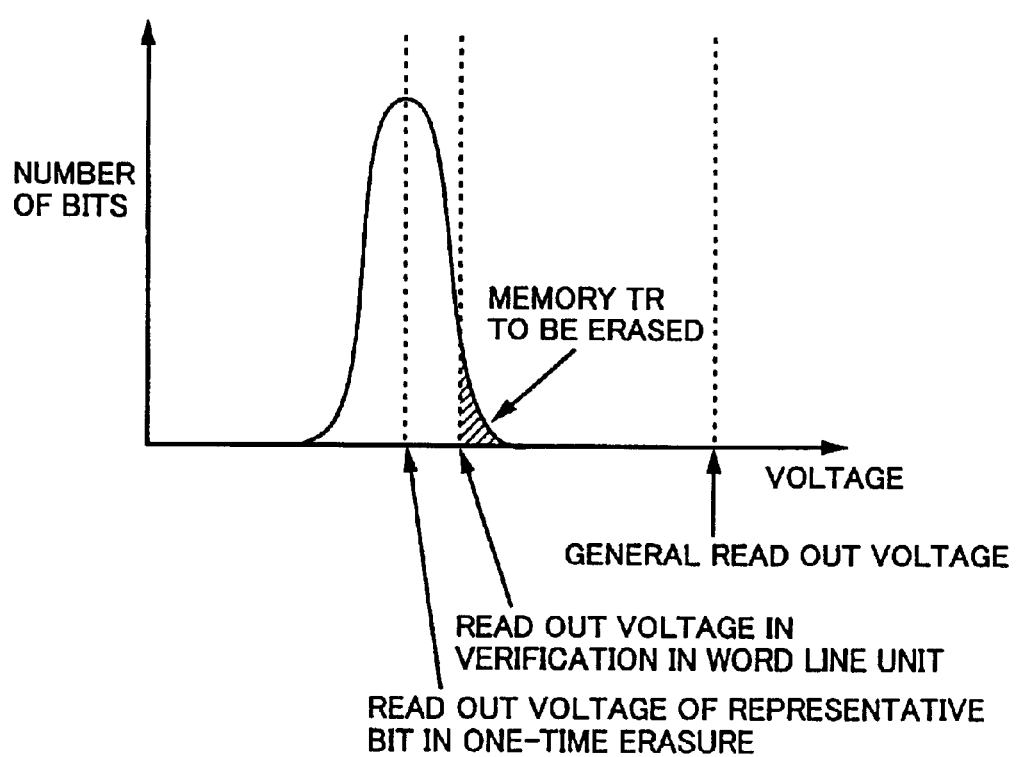
FIG. 17 shows the distribution of a verification voltage in a word line unit, an erasure determine level of a typical bit, and a threshold voltage of the memory cell transistor.
Figure 18:
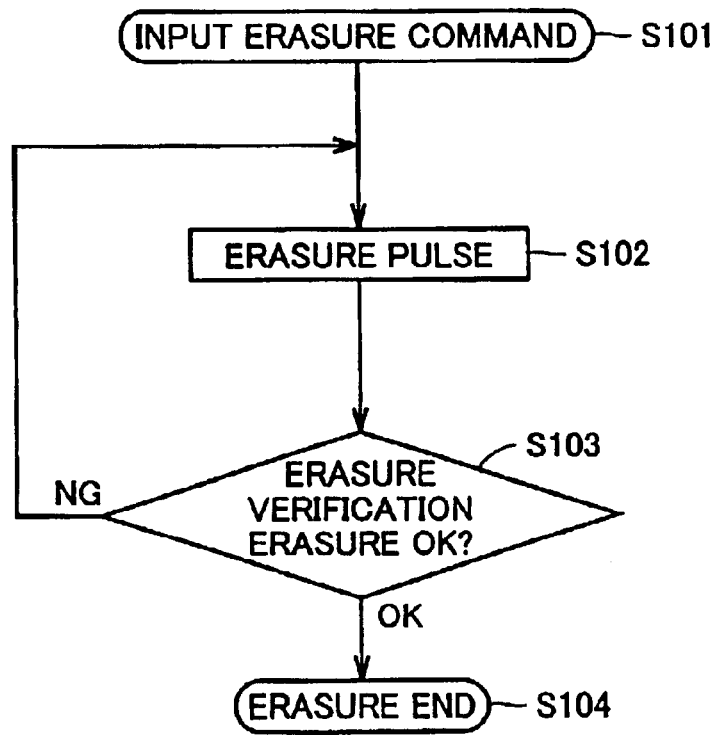
FIG. 18 is a flow chart of an example of the simplest erasure sequence in a conventional flash memory.

FIG. 17 shows the distribution of the verification voltage in the word line unit, the erasure determination level of the respective bit and the threshold voltage of the memory cell transistor.

As shown in FIG. 17, the verify voltage in the word line unit is higher than the erasure determination level of the representative bit. Therefore, most of the memory cell transistors after the erasure verification on the representative bits do not have to be subjected to erasure in the distribution of the threshold voltage of the memory cell transistor in the exposure block.

Since additional erasure is carried out in a word line unit, an erasure pulse is not applied to the memory cell transistor with a sufficient erasure level, as compared to the one-time erasure of all the memory cell transistors. Therefore, the threshold voltage of the memory cell transistor in the erasure block is suppressed from attaining a lower state (increase variation of erasure). Only the few memory cell transistors with insufficient erasure will be subjected to erasure. Thus, an erasure operation can be carried out at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
    a control circuit for controlling at least an erasure operation of said nonvolatile semiconductor memory device:
    a memory cell array having a plurality of memory cells arranged in a matrix,
    said memory cell array being divided into a plurality of memory blocks,
        each said memory cell including a memory element that can store data in a nonvolatile manner,
        each said memory element including a first node and second node, and configured for erasing stored data in response to application of a predetermined voltage across at least said first and second nodes;
    a plurality of power supply lines, provided corresponding to said memory blocks, respectively, for supplying in common a first potential to said first node of a plurality of said memory elements in a corresponding memory block;
    a plurality of word lines provided corresponding to a row in said memory cell array, each word line coupled with said second node of said memory element belonging to a corresponding row;
    a row select circuit for supplying a second potential having said predetermined voltage with respect to said first potential selectively to each of said plurality of word lines under control of said control circuit; and
    a potential drive circuit for supplying said first potential selectively to each of said plurality of power supply lines under control of said control circuit,
    wherein said row select circuit is configured for supplying a verification potential selectively to each of said plurality of word lines under control of said control circuit,
    said nonvolatile semiconductor memory device further comprising:
    a plurality of bit lines provided for every column in said memory cell array, each bit line for reading out data from said memory element belonging to a corresponding column, and
    a sense amplifier for detecting a data level read out via said bit line,
    wherein said control circuit is configured for determining for every word line an erased state of said memory element in an amplification of said verification potential according to a detected result of said sense amplifier.

2. The nonvolatile semiconductor memory device according to claim 1, further comprising:
    an erasure information storage circuit for storing information indicating an erased state determined for every said word line, and
    an erasure voltage apply control circuit for applying at one time said second potential to a plurality of word lines selected according to the information stored in said erasure information storage circuits out of said plurality of word lines in said memory block.

3. The nonvolatile semiconductor memory device according to claim 1, further comprising an erasure information storage circuit for storing information indicating an erased state determined for every said word line,
    wherein said control circuit is configured for sequentially applying said second potential according to information stored in said erasure information storage circuit to said plurality of word lines in said memory block.

4. A nonvolatile semiconductor memory device comprising:
    a control circuit for controlling at least an erasure operation of said nonvolatile semiconductor memory device;
    a memory cell array having a plurality of memory cells arranged in a matrix,
    said memory cell array being divided into a plurality of memory blocks,
        each said memory cell including a memory element that can store data in a nonvolatile manner,
        each said memory element including a first node and second node, and configured for erasing stored data in response to application of a predetermined voltage across at least said first and second nodes;
    a plurality of power supply lines, provided corresponding to said memory blocks, respectively, for supplying in common a first potential to said first node of a plurality of said memory elements in a corresponding memory block;
    a plurality of word lines provided corresponding to a row in said memory cell array, each word line coupled with said second node of said memory element belonging to a corresponding row;
    a row select circuit for supplying a second potential having said predetermined voltage with respect to said first potential selectively to each of said plurality of word lines under control of said control circuit; and a potential drive circuit for supplying said first potential selectively to each of said plurality of power supply lines under control of said control circuit, wherein said word line is provided in plurality for one row in said memory cell array, said nonvolatile semiconductor memory device further comprising a plurality of main word lines provided common to a plurality of said belonging to a row in said memory cell array, and a select couple circuit for selectively transmitting a level of said main word line to said word line under control of said row select circuit, wherein said row select circuit is configured for selectively rendering main word line and said select couple circuit to supply a second potential selectively to each of said plurality of word lines under control of said control circuit.

5. The nonvolatile semiconductor memory device according to claim 4, wherein said row select circuit is configured for selectively rendering active said main word line and said select couple circuit to supply a verification potential selectively to each of said plurality of word lines under control of said control circuit, said nonvolatile semiconductor memory device further comprising:

a plurality of bit lines provided for every column in said memory cell array, each bit line for reading out data from said memory element belonging to a corresponding column, and a sense amplifier for detecting a data level read out via said bit line, wherein said control circuit is configured for determining for every said word line an erased state of said memory element in applying said verification potential.

6. The nonvolatile semiconductor memory device according to claim 5, further comprising:

an erasure information storage circuit for storing information indicating an erased state determined for every said word line, and an erasure voltage apply control circuit for applying at one time said second potential to a plurality of word lines selected according to the information stored in said erasure information storage circuit, out of said plurality of word lines in said memory block.

7. The nonvolatile semiconductor memory device according to claim 5, further comprising an erasure information storage circuit for storing information indicating an erased state determined for every said word line, wherein said control circuit is configured for sequentially applying said second potential according to information stored in said erasure information storage circuit to said plurality of word lines in said memory block.

8. A nonvolatile semiconductor memory device comprising:

a control circuit for controlling at least an erasure operation of said nonvolatile semiconductor memory device;

a memory cell array having a plurality of memory cells arranged in a matrix, said memory cell array being divided into a plurality of memory blocks, each said memory cell including a memory element that can store data in a nonvolatile manner, each said memory element including a first node and second node, and configured for erasing stored data in response to application of a predetermined voltage across at least said first and second nodes;

a plurality of power supply lines, provided corresponding to said memory blocks, respectively, for supplying in common a first potential to said first node of a plurality of said memory elements in a corresponding memory block;

a plurality of word lines provided corresponding to a row in said memory cell array, each word line coupled with said second node of said memory element belonging to a corresponding row;

a row select circuit for supplying a second potential having said predetermined voltage with respect to said first potential selectively to each of said plurality of word lines under control of said control circuit; and a potential drive circuit for supplying said first potential selectively to each of said plurality of power supply lines under control of said control circuit, wherein said row select circuit is configured to be able to supply said second potential at one time to a plurality of said word lines in said memory block under control of said control circuit, wherein said control circuit is configured for supplying said first potential and said second potential at one time to at least some of a plurality of said memory elements among said memory elements in said memory block, and then for selectively supplying said second potential to each of said plurality of word lines.

9. The nonvolatile semiconductor memory device according to claim 8, wherein said control circuit is configured for supplying said first potential and said second potential at one time to a plurality of said memory elements in said memory block, and then selectively supplying said second potential to each of said plurality of word lines.

10. The nonvolatile semiconductor memory device according to claim 9, wherein said row select circuit is configured for supplying said first and second verification potentials selectively to each of said plurality of word lines under control of said control circuit, said nonvolatile semiconductor memory device further comprising a plurality of bit lines provided for every column in said memory cell array, each bit line for reading out data from said memory element belonging to a corresponding column, and a sense amplifier for detecting a data level read out via said bit line, wherein said control circuit is configured for supplying said first potential and said second potential at one time to a plurality of said memory elements in said memory block, and then selectively supplying said second potential to each of said plurality of word lines when determination is made that erasure as to said first verification potential is completed according to a detected result of said sense amplifier, and is configured for determining for every said word line an erased state of said memory element in applying said second verification potential according to a detected result of said sense amplifier.

11. The nonvolatile semiconductor memory device according to claim 10, wherein said first verification potential is higher than said second verification potential.

12. The nonvolatile semiconductor memory device according to claim 10, wherein said first verification potential is lower than said second verification potential.

13. The nonvolatile semiconductor memory device according to claim 8, wherein said row select circuit supplying a verification potential selectively for every said word line under control of said control circuit, said nonvolatile semiconductor memory device further comprising:

a plurality of bit lines provided for every column in said memory cell array, each bit line for reading out data from said memory element belonging to a corresponding column, and a sense amplifier to detect a data level read out via said bit line, wherein said control circuit supplies said first and second potential at one time to a plurality of said memory elements in said memory block, and then selectively supplies said second potential to each of said plurality for word lines according to a detected result of said sense amplifier on predetermined plurality of said memory elements among said memory elements in said memory block.

14. The nonvolatile semiconductor memory device according to claim 8, wherein said row select circuit supplies first and second verification potentials selectively to each of for said plurality of word line under control of said control circuit, wherein said control circuit supplies said first potential and said second potential at one time to a plurality of said memory elements in said memory block, and then when determination is made that erasure as to said first verification potential has ended according to a detected result of said sense amplifier on a predetermined plurality of said memory elements among said memory elements in said memory block, supplying said second potential selectively to each of said plurality of word line, and is configured for determining for every said word line an erased state of said memory element in applying said second verification potential.

15. The nonvolatile semiconductor memory device according to claim 14, wherein said first verification potential is higher than said second verification potential.

16. The nonvolatile semiconductor memory device according to claim 14, wherein said first verification potential is lower than said second verification potential.

17. The nonvolatile semiconductor memory device according to claim 14, wherein said control circuit selects a word line of interest for determination according to information stored in said erasure information storage circuit, and determines for every selected said word line an erased state of said memory element in applying said verification potential according to a detected result of said sense amplifier.

18. The nonvolatile semiconductor memory device according to claim 17, wherein said erasure information storage circuit is configured for storing information indicating a determined erased state for every plurality of bits read out by one addressing.

* * * * *